United States Patent
Itoh

(10) Patent No.: US 6,911,686 B1
(45) Date of Patent: Jun. 28, 2005

(54) SEMICONDUCTOR MEMORY DEVICE HAVING PLANARIZED UPPER SURFACE AND A SION MOISTURE BARRIER

(75) Inventor: Akio Itoh, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/594,091

(22) Filed: Jun. 15, 2000

(30) Foreign Application Priority Data

Jun. 17, 1999 (JP) .......................................... 11-170667

(51) Int. Cl.⁷ .......................................... H01L 27/108
(52) U.S. Cl. ...................... 257/296; 257/306; 257/310; 257/522; 257/535; 257/637; 257/638; 257/752
(58) Field of Search ................................ 257/296, 306, 257/310, 522, 535, 637, 638, 752

(56) References Cited

U.S. PATENT DOCUMENTS

| 5,847,464 A | * 12/1998 | Singh et al. ................. 257/752 |
| 5,990,491 A | * 11/1999 | Zhang .......................... 257/57 |
| 5,990,507 A | * 11/1999 | Mochizuki et al. .......... 257/295 |
| 6,017,784 A | 1/2000 | Ohta et al. |
| 6,046,490 A | * 4/2000 | Arita et al. .................. 257/535 |
| 6,246,105 B1 | * 6/2001 | Morozumi et al. .......... 257/640 |

FOREIGN PATENT DOCUMENTS

| EP | 0 877 422 A1 | 11/1998 | | |
| JP | 9-51077 | 2/1977 | | |
| JP | 07-050295 | 2/1995 | | |
| JP | 8-130199 | 5/1996 | | |
| JP | 8-203890 | 8/1996 | | |
| JP | 09-199495 | 7/1997 | | |
| JP | 9-307074 | 11/1997 | | |
| JP | 10-079491 | 3/1998 | | |
| JP | 10-189578 | 7/1998 | | |
| JP | 10-275897 | 10/1998 | | |
| JP | 11-17124 | 1/1999 | | |
| JP | 11-87633 A | * 3/1999 | ........... H01L/27/10 |
| JP | 11-87647 | 3/1999 | | |
| JP | 11-145286 | 5/1999 | | |
| JP | 11-238855 | 8/1999 | | |
| JP | 2000-36568 | 2/2000 | | |
| JP | 2000-269434 | 9/2000 | | |

OTHER PUBLICATIONS

US 5,932,901, 8/1999, Itabashi et al. (withdrawn)
Japanese Office Action dated Jul. 3, 2001.

* cited by examiner

*Primary Examiner*—Tom Thomas
*Assistant Examiner*—Matthew E. Warren
(74) *Attorney, Agent, or Firm*—Westerman, Hattori Daniels & Adrian, LLP

(57) ABSTRACT

There is provided a semiconductor device which is manufactured via steps of forming a capacitor which is obtained by forming in sequence an upper electrode, a dielectric film formed of ferroelectric material or high-dielectric material, and a lower electrode on a semiconductor substrate, then forming an interlayer insulating film on the capacitor, then planarizing a surface of the interlayer insulating film by the CMP polishing, then removing a moisture attached to a surface of the interlayer insulating film or a moisture contained in the interlayer insulating film by applying the plasma annealing using an $N_2O$ gas, and then forming a redeposited interlayer film on the interlayer insulating film.

12 Claims, 23 Drawing Sheets

SEMICONDUCTOR MEMORY DEVICE HAVING PLANARIZED UPPER SURFACE AND A SION MOISTURE BARRIER

BACKGROUND OF THE INVENTION

1. Field of the Invention

The present invention relates to a semiconductor device and a method of manufacturing the same and, more particularly, a semiconductor device represented by a nonvolatile semiconductor memory (FeRAM: Ferroelectric Random Access Memory) using ferroelectric material for a dielectric film of a capacitor, or a volatile semiconductor memory (DRAM: Dynamic Random Access Memory) using high-dielectric material for the dielectric film of the capacitor, or a hybrid system LSI consisting of such memory device and a logic device, and a method of manufacturing the same.

2. Description of the Prior Art

In recent years, FeRAM which uses the ferroelectric material for the dielectric film of the capacitor become the focus of public attention as the nonvolatile semiconductor memory with low power consumption. Also, in recent years, miniaturization and higher integration of the semiconductor memory are requested. In order to satisfy such request, DRAM that uses the high-dielectric material for the dielectric film of the capacitor has been developed.

Normally, metal oxides are used as the ferroelectric material of FeRAM and the high-dielectric material of DRAM respectively.

Such the ferroelectric material and the high-dielectric material are weak at the reducing atmosphere. Especially the ferroelectric material has such a property that the polarization characteristic is readily degraded.

In Patent Application Publication (KOKAI) Hei 9-307074, as the method of preventing the degradation in the polarization characteristic of the ferroelectric material, it is set forth that reduction of the dielectric film of the capacitor can be prevented if an underlying insulating film formed of sputter silicon oxide or SOG (Spin-On-Glass) is formed on the capacitor and then an overlying insulating film formed of silicon oxide is formed on the underlying insulating film by using ozone and TEOS (tetraethoxysilane: $Si(OC_2H_5)_4$). Also, in Patent Application Publication (KOKAI) Hei 10-275897, it is set forth that the degradation in the polarization characteristic of the capacitor formed below the wiring conductive film can be prevented if the wiring conductive film is not formed in the reducing atmosphere by using the metal CVD (Chemical Vapor Deposition) equipment or the MO (Metal Organic) CVD equipment, but formed by the DC sputter. In this Publication, it is also set forth that the $SiO_2$ film is formed on the capacitor by the plasma enhanced CVD method using TEOS and then the wiring is connected the upper electrode of the capacitor via the hole formed in the $SiO_2$ film.

In addition, in Patent Application Publication (KOKAI) Hei 11-238855, such a structure is set forth that the thin conductive pattern (wiring) is connected the upper electrode of the capacitor via the hole formed in the thin insulating film covering the capacitor, then the thick aluminum wiring pattern is formed on the insulating film covering the conductive pattern, and then the insulating film is formed to cover the aluminum wiring pattern.

However, in Patent Application Publication (KOKAI) Hei 11-238855, since the film thickness of the aluminum wiring pattern used as the bit line is thick, the level of surface unevenness of the interlayer insulating film formed on the wiring pattern is increased.

Then, if the unevenness of the interlayer insulating film covering the aluminum wiring pattern is increased, the focus of the exposure light is ready to be defocused in the photolithography step applied to form the upper wiring on the interlayer insulating film. Thus, the problem that patterning precision of the upper wiring is lowered is caused. In particular, if the interlayer insulating film is formed by the plasma enhanced CVD method, the level of the surface unevenness of the interlayer insulating film is ready to increase.

In contrast, it is possible to consider that the HDP (High Density Plasma) CVD $SiO_2$ film which has small surface unevenness may be formed. In this case, there is a possibility that hydrogen attacks into the insulating film in forming the HDP CVD $SiO_2$ film to thus reduce the oxide dielectric film of the capacitor

SUMMARY OF THE INVENTION

It is an object of the present invention to provide a semiconductor device capable of forming the wiring, that is formed over the capacitor using ferroelectric material or high-dielectric material and the bit line, with good precision and also preventing degradation of the capacitor, and a method of manufacturing the same.

According to one aspect of the present invention, the semiconductor device comprises the capacitor using the ferroelectric material or the high-dielectric material, the first wiring formed on the capacitor via the insulating film, the insulating film which is formed on the first wiring and whose upper surface is planarized, and the second wiring formed on the insulating film.

Therefore, the pattern of the second wiring formed over the capacitor using the ferroelectric material or the high-dielectric material can be formed with good precision.

Also, another aspect of the present invention includes the steps of forming the first insulating film over the capacitor after the capacitor using the ferroelectric material or the high-dielectric material as the dielectric film is formed, and then planarizing the first insulating film by the CMP (Chemical Mechanical Polishing) method, for example.

In the polishing step, not only the moisture in the abrasive agent or the moisture in the cleaning solution is attached to the surface of the first insulating film, but also the moisture enters into the first insulating film. In the present invention, in order to remove the moisture attached to the surface of the first insulating film and the moisture entering into the first insulating film, the dehydration process is applied to the polished surface of the first insulating film by the plasma annealing in the plasma atmosphere of the $N_2O$ gas or the NO gas, for example.

Incidentally, if the moisture in/on the insulating film is removed in the electric furnace, the heating temperature in the electric furnace is limited to under 450° C. for preventing the metal wiring, for example, aluminum wiring, under the insulating film from deteriorating. However, the annealing of such the low temperature is incompetent to bring an effect of the dehydration. While, in the present invention, the plasma annealing is competent to remove the moisture in/on the insulating film under 450° C. And, the metal wiring under the insulating layer is hard to be oxidized in the low temperature of under 450° C.

The moisture in the first insulating film can be removed more firmly by the plasma annealing rather than the simple thermal process. Therefore, reduction of the ferroelectric film or the high-dielectric film and degradation of the capacitor due to the moisture on the surface of the first insulating film or in the first insulating film can be prevented, and thus the good FeRAM or DRAM can be manufactured.

When the first insulating film is formed of silicon oxide, at least the surface of the first insulating film includes nitrogen after the plasma annealing used $N_2O$ or $N_2$.

When the cavities (blowholes, voids or key holes) are formed in the first insulating film whose surface is planarized by the CMP method, the cavities are exposed from the polished surface like slits in some cases. Then, if the wiring layer is formed on the polished surface, there is such a possibility that, because the conductive material constituting the wiring layer is filled into the cavities, a plurality of wiring crossing the cavities are short-circuited. For this reason, it is preferable that the second insulating film should be formed on the polished surface of the first insulating film to cover or fill the cavities exposed from the polished surface of the first insulating film.

In order to achieve the above advantage without fail, it is preferable that the thickness of the second insulating film is set to 100 nm or more.

If the cavities being not covered with the second insulating film is produced partially since the width of the cavities exposed from the polished surface is varied, there is a possibility that slits are formed on a part of slits in the metal film formed on the second insulating film. If the slits exit on the metal film, the capacitor is degraded in some cases because the hydrogen enters into the first insulating film via the slits. Therefore, it is preferable that, in order to prevent generation of the slits on the metal film, the film thickness of the second insulating film should be set to at least 300 nm.

In addition, the second insulating film is formed on the first insulating film and then the above plasma annealing may be applied. In this case, not only degradation of the first and second insulating films can be avoided, but also the moisture contained in the first and second insulating films can be removed simultaneously.

DETAILED DESCRIPTION OF THE PREFERRED EMBODIMENTS

Embodiments of the present invention will be explained in detail with reference to the accompanying drawings hereinafter.

FIGS. 1 to 16 are sectional views showing a semiconductor device manufacturing method according to an embodiment of the present invention in order of the manufacturing step. In this disclosure, FeRAM will be explained by way of example of the semiconductor device of the embodiment.

First, steps required to obtain a sectional shape shown in FIG. 1 will be explained hereunder.

Figure 1:
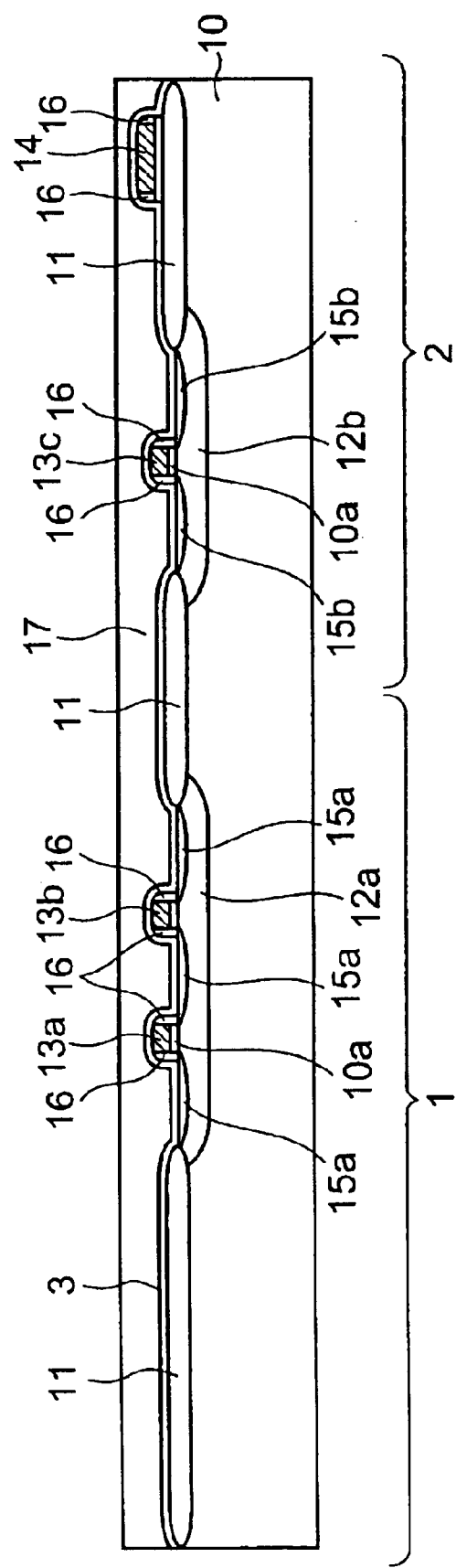
FIGS. 1 to 16 are sectional views showing a semiconductor device manufacturing method according to an embodiment of the present invention.

As shown in FIG. 1, by using LOCOS (Local Oxidation of Silicon) method, a device isolation insulating film 11 is formed on a part of a surface of a p-type silicon (semiconductor) substrate 10 selectively. Other device isolation structure forming method in addition to LOCOS, a method of STI (Shallow Trench Isolation) may be employed as the device isolation insulating film 11.

After such device isolation insulating film 11 is formed, a p-well 12a and an n-well 12b are formed by doping selectively p-type impurity and n-type impurity into predetermined active regions (transistor forming regions) of a memory cell region 1 and a peripheral circuit region 2 on the silicon substrate 10. Although not shown in FIG. 1, a p-well (not shown) used to form CMOS is also formed in the peripheral circuit region 2.

Then, a silicon oxide film is formed as a gate insulating film 10a by thermally oxidizing a surface of the active region of the silicon substrate 10.

Then, an amorphous silicon film and a tungsten silicide film are formed in sequence on the overall upper surface of the silicon substrate 10, and then the amorphous silicon film and the tungsten silicide film are patterned into predetermined shapes by the photolithography method. Thus, gate electrodes 13a to 13c and a wiring 14 are formed. A polysilicon film may be formed in place of the amorphous silicon film constituting the gate electrodes 13a to 13c.

In the memory cell region 1, two gate electrodes 13a, 13b are arranged in almost parallel on one p-well 12a. These gate electrodes 13a, 13b constitute a part of the word line WL.

Then, in the memory cell region 1, n-type impurity diffusion regions 15a serving as source/drain of the n-channel MOS transistor are formed by implanting n-type impurity into the p-well 12a on both sides of the gate electrodes 13a, 13b. At the same time, an n-type impurity diffusion region may be formed on the p-well (not shown) of the peripheral circuit region 2. In turn, in the peripheral circuit region 2, p-type impurity diffusion regions 15b serving as source/drain of the p-channel MOS transistor are formed by implanting p-type impurity into the n-well 12b on both sides of the gate electrode 13c. The implantation of the n-type impurity and the p-type impurity is separated by using the resist pattern.

Then, an insulating film is formed on the overall surface of the silicon substrate 10, and then sidewall insulating films 16 are formed on both sides of the gate electrodes 13a, 13b and the wiring 14 by etching back the insulating film. Silicon oxide ($SiO_2$) may be formed as the insulating film by the CVD method, for example.

Then, a silicon oxide-nitride (SiON) film of about 200 nm thickness is formed as a cover film 3 on the overall surface of the silicon substrate 10 by the plasma enhanced CVD method. Then, the silicon oxide ($SiO_2$) of about 1.0 μm thickness is grown on the cover film 3 by the plasma enhanced CVD method using a TEOS gas, whereby a first interlayer insulating film 17 is formed. In this case, the $SiO_2$ film that is formed by the plasma enhanced CVD method using the TEOS gas is also referred to as a TEOS film hereinafter.

Then, as the densifying process of the first interlayer insulating film 17, such first interlayer insulating film 17 is annealed at the temperature of 700° C. for 30 minutes in the nitrogen atmosphere at the atmospheric pressure. Then, an upper surface of the first interlayer insulating film 17 is planarized by polishing the first interlayer insulating film 17 by using the CMP (Chemical Mechanical Polishing) method.

Figure 2:
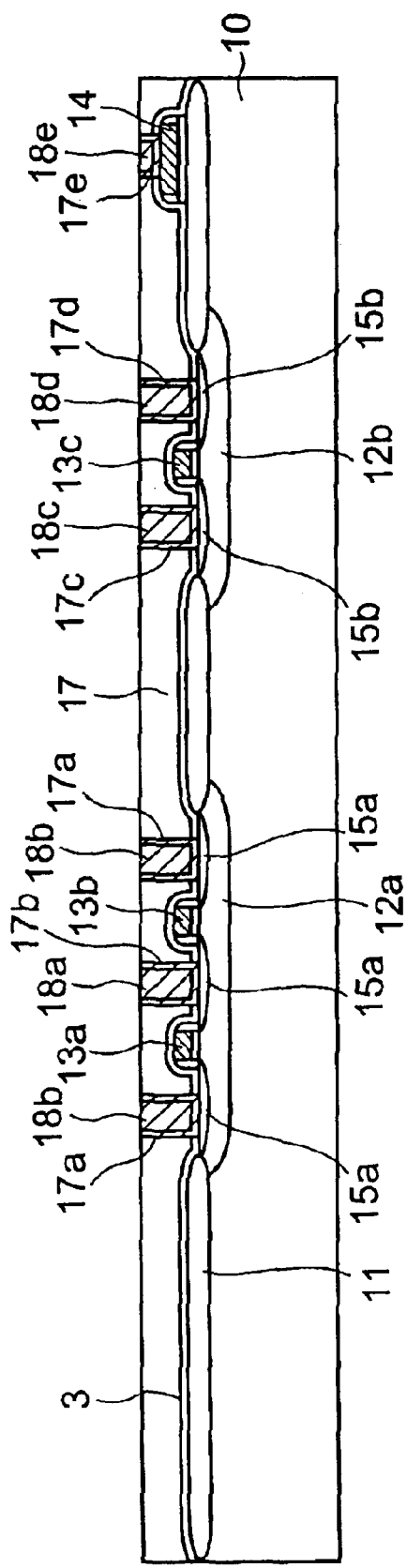

Next, steps required to obtain a sectional shape shown in FIG. 2 will be explained hereunder.

First, contact holes 17a to 17d whose depth reaches the impurity diffusion regions 15a, 15b and a via hole whose depth reaches the wiring 14 are formed in the first interlayer insulating film 17 by the photolithography method respectively. Then, a Ti (titanium) thin film of 20 nm thickness and a TiN (titanium nitride) thin film of 50 nm thickness are formed in sequence on the first interlayer insulating film 17 and in the holes 17a to 17e by the sputter method. Then, W (tungsten) is grown on the TiN thin film by the CVD method. As a result, the tungsten film is buried in the contact holes 17a to 17d and the via hole 17e.

Then, the tungsten film, the TiN thin film, and the Ti thin film are polished by the CMP method until the upper surface of the first interlayer insulating film 17 is exposed. The tungsten film, etc. remained in the holes 17a to 17e after this polishing are used as plugs 18a to 18e that are used to electrically connect a wiring (interconnection) described later to the impurity diffusion regions 15a, 15b and the wiring 14.

The first plug 18a formed on the n-type impurity diffusion region 15a, that is put between two gate electrodes 13a, 13b on one p-well 12a in the memory cell region 1, is connected to the bit line described later, and two remaining second plugs 18b are connected to the capacitor described later.

In this case, after the contact holes 17a to 17d and the via hole 17e are formed, impurity may be ion-implanted into the impurity diffusion regions 15a, 15b for the purpose of contact compensation.

Figure 3:
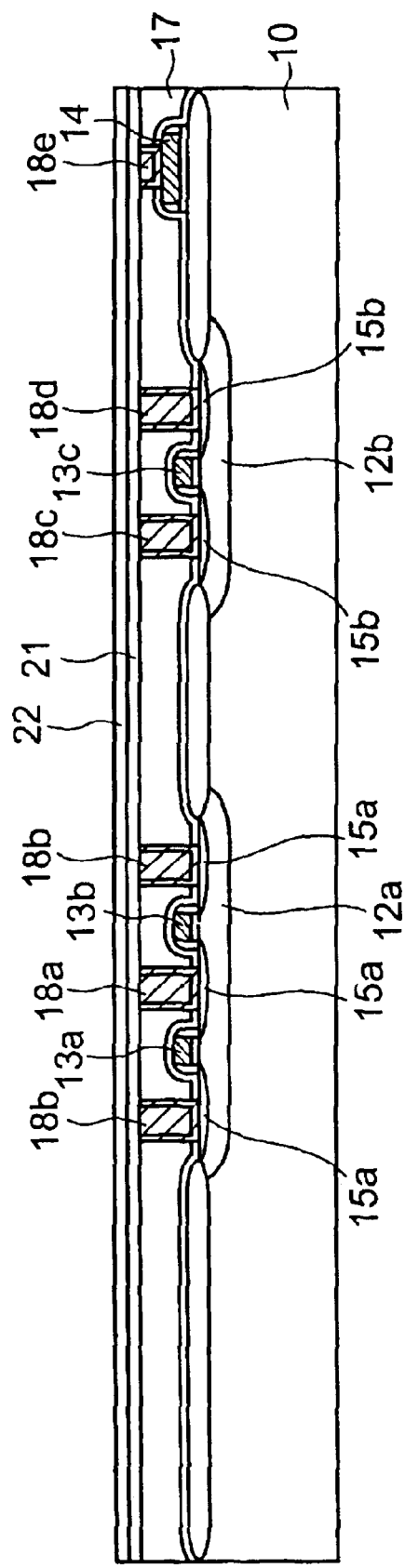

Then, as shown in FIG. 3, in order to prevent the oxidation of the plugs 18a to 18e, an SiON film (insulating film) 21 of 100 nm thickness is formed on the first interlayer insulating film 17 and the plugs 18a to 18e by the plasma enhanced CVD method using silane ($SiH_4$) and then an $SiO_2$ film 22 of 150 nm thickness is formed by the plasma enhanced CVD method using TEOS and oxygen as a reaction gas. This SiON film 21 is formed to prevent the penetration of the moisture into the first interlayer insulating film 17.

Then, in order to densify the SiON film 21 and the $SiO_2$ film 22, these films are annealed at the temperature of 650° C. for 30 minutes in the nitrogen atmosphere at the atmospheric pressure.

The first interlayer insulating film 17 and the $SiO_2$ film 22, that are formed by the plasma enhanced CVD method using the TEOS gas, are annealed at the temperatures of 700° C. and 650° C. respectively. In this case, since the metal film such as the aluminum film with a low melting point does not exit below these films, the annealing of these films to such extent exerts no bad influence upon the underlying film.

Figure 4:
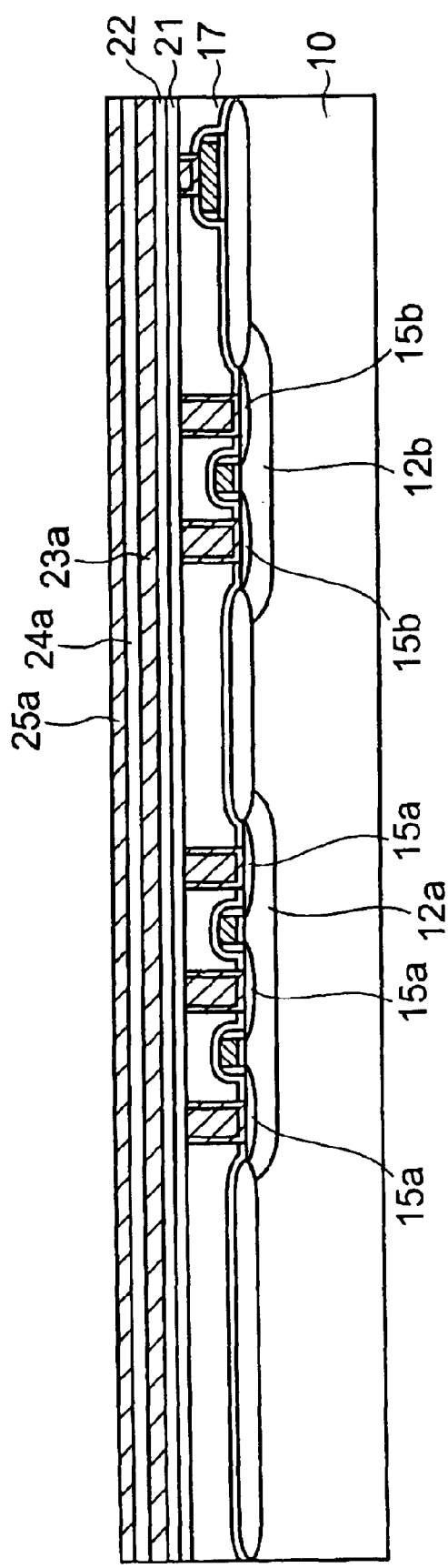

Next, as shown in FIG. 4, a first conductive film 23a having a double-layered structure is formed on the $SiO_2$ film 22 by depositing Ti and Pt (platinum) in sequence with the use of the DC (Direct Current) sputter method. In this case, a thickness of the Ti film is set to about 10 to 30 nm, and a thickness of the Pt film is set to about 100 to 300 nm. For example, a thickness of the Ti film is set to 20 nm, and a thickness of the Pt film is set to 175 nm. A film made of iridium, ruthenium, ruthenium oxide, iridium oxide, strontium ruthenium oxide ($SrRuO_3$), or the like may be formed as the first conductive film 23a.

Then, a PZT film 24a of 100 to 300 nm thickness is formed on the first conductive film 23a by depositing lead zirconate titanate (PZT: $Pb(Zr_{1-x}Ti_x)O_3$) as the ferroelectric material by using the RF (Radio Frequency) sputter method. For example, a thickness of the PZT film 24a is set to 240 nm.

Then, as the crystallizing process of the PZT film 24a, the RTA (Rapid Thermal Annealing) of the PZT film 24a is performed at the temperature of 650° C. to 850° C. for 30 to 120 seconds in the oxygen atmosphere. For example, the PZT film 24a is annealed at the temperature of 750° C. for 60 seconds.

As the method of forming the ferroelectric film, there are the spin-on method, the sol-gel process, the MOD (Metal Organic Deposition) method, and the MOCVD method in addition to the above sputter method. Also, as the ferroelectric material, there are lanthanum lead zirconate titanate (PLZT), $SrBi_2(Ta_xNb_{1-x})_2O_9$ (where 0<x<1), $Bi_4Ti_3O_{12}$, etc. in addition to PZT. In addition, in order to construct the DRAM, the high-dielectric material such as $(BaSr)TiO_3$ (BST), strontium titanate (STO), etc. may be used in place of the above ferroelectric material.

After such PZT film 24a is formed, a Pt film of 100 to 300 nm thickness is formed as a second conductive film 25a on the PZT film 24a by the DC sputter method. For example, a thickness of the second conductive film 25a is set to 200 nm. As the second conductive film 25a, an iridium oxide ($IrO_2$) film or ruthenium strontium oxide (SRO) may be formed by the sputter method.

Figure 5:
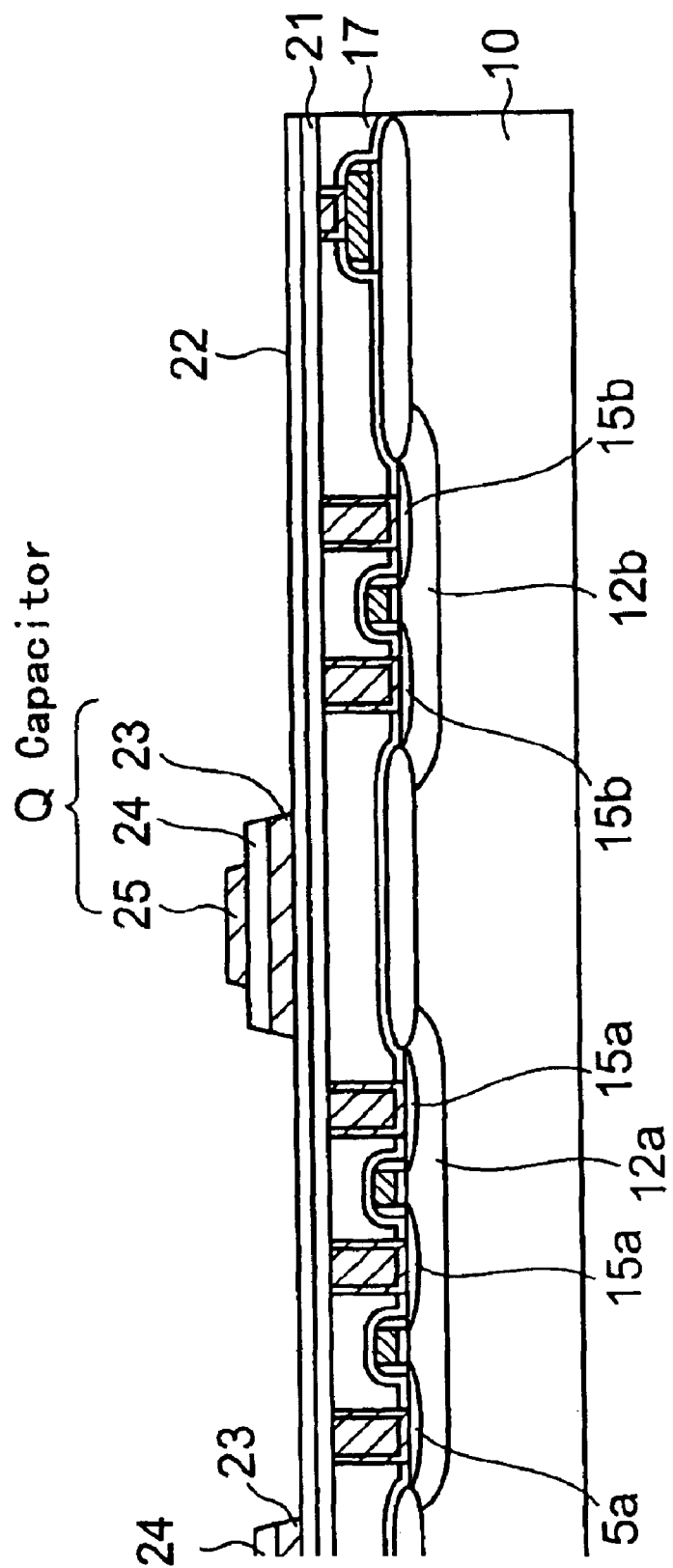

Then, a capacitor Q having a predetermined shape, as shown in FIG. 5, is formed by patterning the second conductive film 25a, the PZT film 24a, and the first conductive film 23a in sequence by virtue of the photolithography method.

At this time, the second conductive film 25a serves as an upper electrode 25, the PZT film 24a serves as a dielectric film 24, and the first conductive film 23a serves as a lower electrode 23. Thus, the capacitor Q is formed of the upper electrode 25, the dielectric film 24, and the lower electrode 23. Actually, the capacitors Q of the same number as the MOS transistors formed in one p-well 12a are formed around the p-well 12a.

Figure 6:
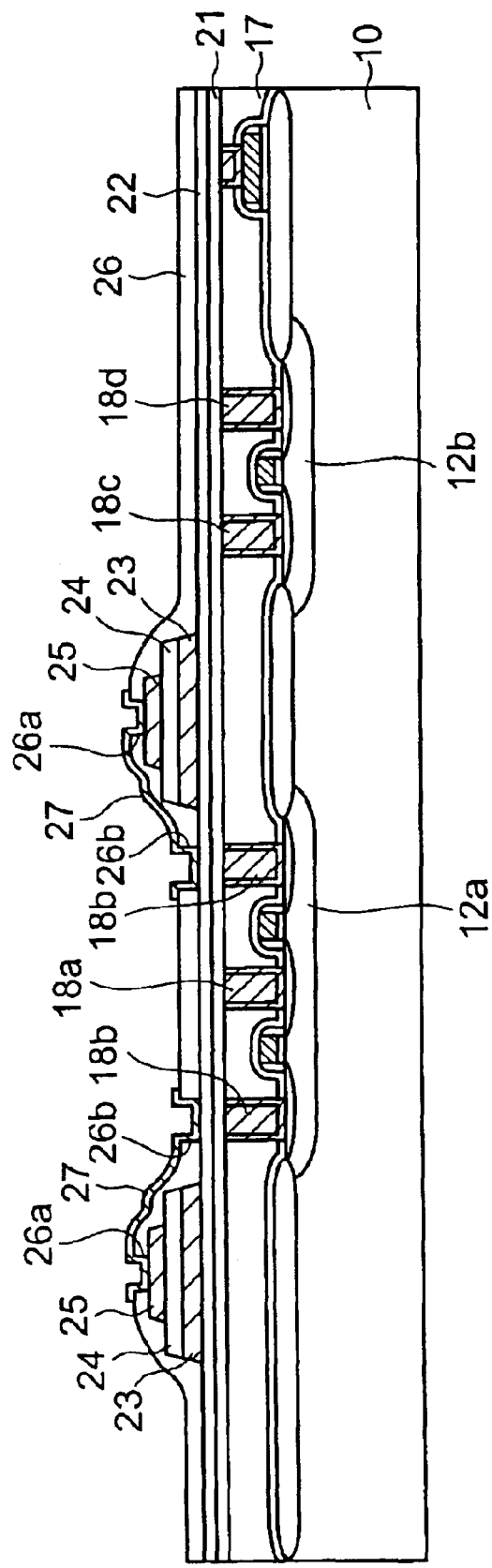

In the meanwhile, after the upper electrode 25 is formed by patterning the second conductive film 25a, the recovery annealing is applied to remove the damage of the capacitor Q. More particularly, after the silicon substrate 10 is placed in the oxygen atmosphere, the capacitor Q is annealed at the temperature of 500 to 700° C. for 30 to 120 minutes. For example, the recovery annealing is applied by heating at the temperature of 650° C. for 60 minutes. Also, after the lower electrode 23 is formed by patterning the first conductive film 23a, the recovery annealing is applied under the same conditions. As shown in FIG. 6, after the capacitor Q is formed via steps mentioned above, a second interlayer insulating film 26 having a double-layered structure consisting of the TEOS film and the SOG (Spin-On-Glass) film is formed on the overall surface such that the capacitor Q is covered by the second interlayer insulating film 26. The TEOS film of 100 to 300 nm thickness is formed on the overall upper surface of the silicon substrate 10 by the plasma enhanced CVD method using the TEOS gas at the growth temperature of 390° C. and the electric power of 400 W. Also, the SOG film is formed by coating an SOG solution on the TEOS film to have a thickness of 80 to 200 nm and then heating the SOG solution. In this example, a thickness of the TEOS film is set to 200 nm and a thickness of the SOG film is set to 100 nm. Here, since the SOG film is a coating insulating film, surface unevenness of the SOG film becomes small.

The SOG film may be removed. In this case, the thickness of the SOG film is 100 nm, and the thickness of the TEOS film is 500 nm.

Then, a contact hole 26a is formed on the upper electrode 25 of the capacitor Q by patterning the second interlayer insulating film 26 by virtue of the photolithography method. Then, the recovery annealing is applied the dielectric film 24. More particularly, the capacitor Q is annealed in the oxygen atmosphere at the temperature of 500 to 650° C. for 30 to 120 minutes. In this example, the recovery annealing is applied by heating at the temperature of 550° C. for 60 minutes.

Then, a contact hole 26b is formed on the second plug 18b in the memory cell region 1 by patterning the second interlayer insulating film 26, the SiON film 21, and the $SiO_2$ film 22 by virtue of the photolithography method to expose the second plug 18b. Then, a TiN film of 100 nm thickness is formed on the second interlayer insulating film 26 and in the contact holes 26a, 26b by the sputter method. In turn, a local interconnection 27 that is used to connect electrically the second plug 18b on the p-well 12a and the upper electrode 25 of the capacitor via the contact holes 26a, 26b in the memory cell region 1 is formed by patterning the TiN film by virtue of the photolithography method.

Figure 7:
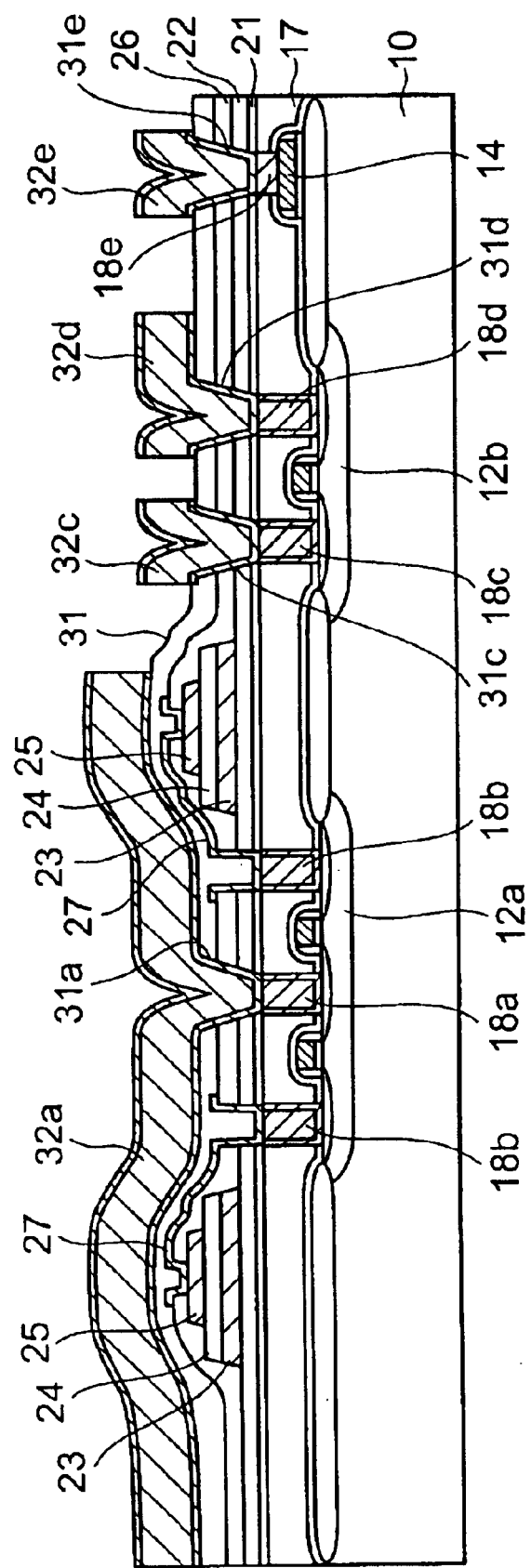

Then, steps required to construct a sectional shape shown in FIG. 7 will be explained hereunder.

First, the TEOS film of 200 to 400 nm, e.g., 300 nm thickness is formed on the local interconnection 27 and the second interlayer insulating film 26 by the plasma enhanced CVD method. This TEOS film is used as a third interlayer insulating film 31. In this case, the unevenness of the upper surface of the third interlayer insulating film 31 is not large to need the polishing, owing to the unevenness of the upper surface of the underlying second interlayer insulating film 26.

Then, if respective films from the third interlayer insulating film 31 to the SiON film 21 are patterned by virtue of the photolithography method, a contact hole 31a is formed on the first plug 18a positioned in a center area of the p-well 12a in the memory cell region 1 and also contact holes 31c to 31e are formed on respective plugs 18c to 18e in the peripheral circuit region 2.

Then, a Ti film, a TiN film, an Al (aluminum) film, and a TiN film are stacked in sequence on the third interlayer insulating film 31 and in the contact holes 31c to 31e to constitute four layers. If these metal films are patterned, a bit line 32a is formed in the memory cell region 1 and also wirings 32c to 32e are formed in the peripheral circuit region 2. The bit line 32a and the wirings 32c to 32e act as the first-layer aluminum wiring (interconnection).

The bit line 32a in the memory cell region 1 is connected to the first plug 18a, and the wirings 32c to 32e in the peripheral circuit region 2 are connected to the plugs 18c to 18e.

As respective thicknesses of metal films constituting the bit line 32a and the wirings 32c to 32e, for example, a thickness of the Ti film as the lowest layer is set to 20 nm, a thickness of the underlying TiN film is set to 50 nm, a thickness of the Al film is set to 500 nm, and a thickness of the overlying TiN film is set to 100 nm.

Figure 8:
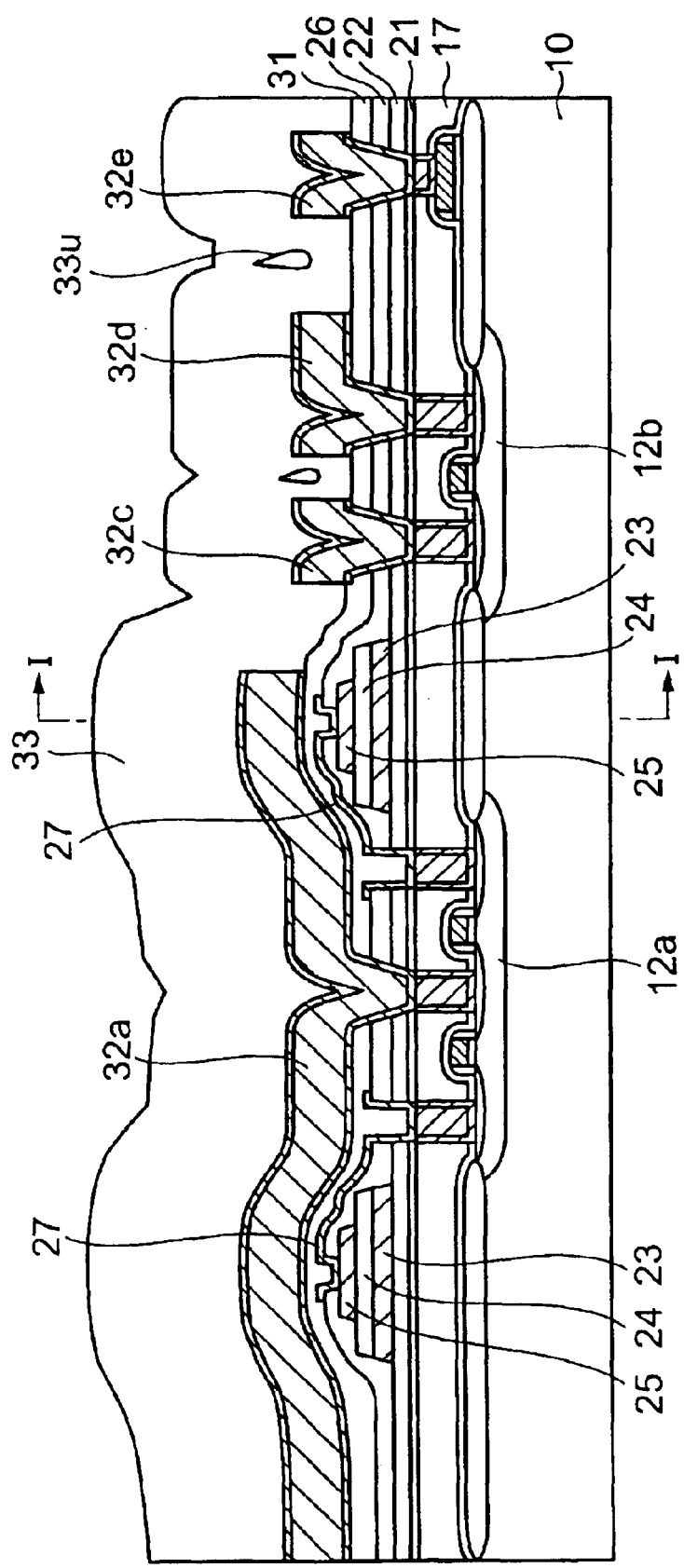

Then, as shown in FIG. 8, a fourth interlayer insulating film 33 that is formed of $SiO_2$ and has a thickness of 2.0 μm is formed on the third interlayer insulating film 31, the bit line 32a, and the wirings 32c to 32e by the plasma enhanced CVD method using the TEOS gas and the oxygen ($O_2$) gas.

The plasma CVD equipment includes a chamber in which a first electrode for loading the silicon substrate 10 thereon and a second electrode opposed to the first electrode are arranged, and a single frequency applying structure which applies a high frequency power to the second electrode and keeps the first electrode at a constant voltage. As the film forming conditions at this time, the growth temperature is less than 400° C., e.g., 390° C., and the pressure is set to 1.2 Pa. Also, the frequency of the high frequency power is 13.56 MHz, and the power is set to 400 W. A flow rate ratio of the oxygen to the TEOS gas is set to about 1, for example. According to these conditions, the ferroelectric material constituting the capacitor Q is hardly degraded during film formation and the bit line 32a and the wirings 32c to 32e are not affected badly.

Meanwhile, since the fourth interlayer insulating film 33 that is formed by the plasma enhanced CVD method using the TEOS gas and the oxygen gas is grown isotropically, the upper surface shape of the fourth interlayer insulating film 33 is easily affected by the shape the underlying first-layer aluminum wiring such as the bit line 32a, the wirings 32c to 32e, etc. Accordingly, when the second-layer aluminum wiring is to be formed on the TEOS film serving as the bit line 32a and the wirings 32c to 32e, such problems are caused that patterning precision of the second-layer aluminum wiring is deteriorated, the disconnection of the wiring easily occurs, etc.

Figure 9:
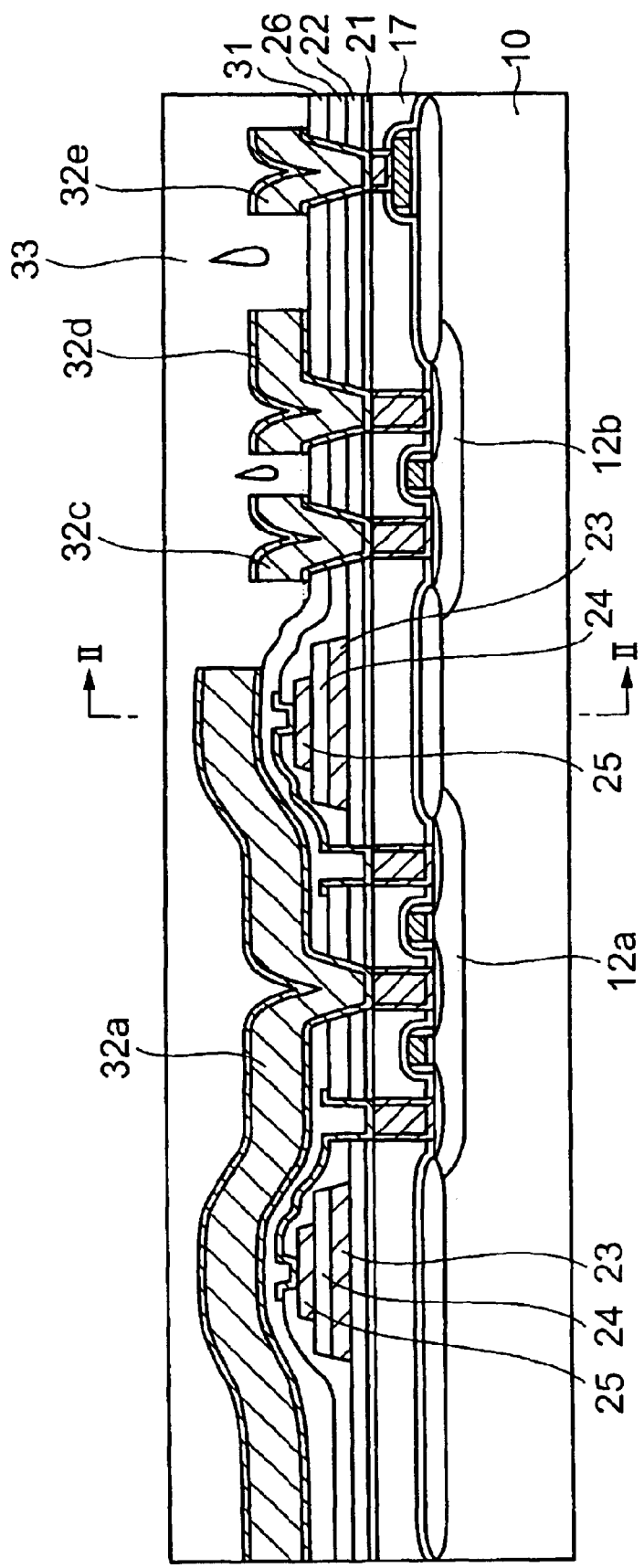

Therefore, as shown in FIG. 9, in order to planarize the upper surface of the TEOS film as the fourth interlayer insulating film 33, the step of polishing the upper surface by the CMP method may be employed. An amount of polishing is set to an about 1.0 μm in thickness from the uppermost surface.

By the way, it becomes apparent based on the experiment that, if the fourth interlayer insulating film 33 is annealed as described later after the fourth interlayer insulating film 33 has been polished by the CMP method, a polarization charge amount of the capacitor Q can be reduced by such annealing.

This is because the moisture in the slurry used in the planarization by the CMP method and the moisture in the cleaning solution used in cleaning thereafter are attached to the surface of the TEOS film as the fourth interlayer insulating film 33 or are absorbed into the inner region of the TEOS film to reach the underlying capacitor Q, and then such moisture degrades the capacitor Q in annealing.

More particularly, it may be guessed that, since the capacitor Q is annealed at the high temperature after the polishing of the fourth interlayer insulating film 33, the ferroelectric material constituting the dielectric film 24 of the capacitor is reduced by the moisture in the interlayer insulating film to loss the ferroelectric property, or interfaces between the ferroelectric material and the electrodes are degraded by the moisture. In particular, if the fourth interlayer insulating film 33 and the third interlayer insulating film 31 are annealed in the situation that the fourth interlayer insulating film 33 is covered with a metal film described later, the moisture absorbed in the fourth interlayer insulating film 33 becomes hard to be discharged to the outside. Thus, the moisture penetrates into the third interlayer insulating film 31 through a clearance between the bit wirings 32a to reach the periphery of the capacitor Q, so that degradation of the capacitor Q due to the moisture is accelerated.

Figure 10:
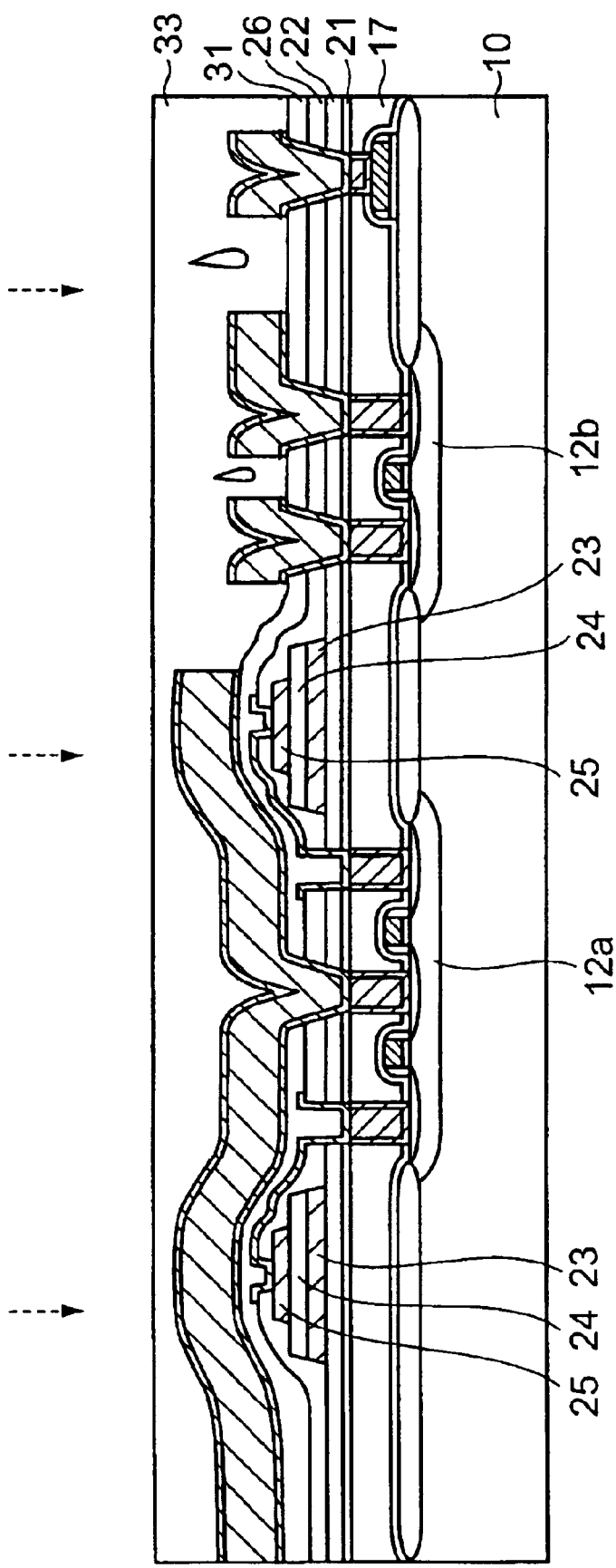

Therefore, as shown in FIG. 10, in order to prevent the degradation of the capacitor Q by removing the moisture that enters into the fourth interlayer insulating film 33 in polishing or the moisture that is attached to the surface, the dehydration process is applied to the fourth interlayer insulating film 33 by the plasma annealing.

In other words, after the fourth interlayer insulating film 33 is planarized by the CMP method, the silicon substrate 10 is loaded in the chamber of the plasma generation equipment (not shown), then an $N_2O$ gas and an $N_2$ gas are supplied into the chamber at flow rates of 700 sccm and 200 sccm respectively and are plasmanized, and then the fourth interlayer insulating film 33 is exposed to the plasma at the substrate temperature of less than 450° C., e.g., 350° C., for three minutes, preferably more than four minutes. Accordingly, the moisture in the fourth interlayer insulating film 33 is discharged to the outside, and SiON is formed in at least the surface of the fourth interlayer insulating film 33 by introducing nitrogen and thus the moisture is hard to enter there into after this.

If the plasma TEOS film is nitrogenized by heating without plasma, in $N_2$ atmosphere, the nitrogenizing temperature is required more than 1000° C. Because, the $N_2$ is inactive, when more active gas than $N_2$ gas, for example, ammonia ($NH_3$) gas, is employed to nitrogenize the plasma TEOS, the heating temperature is required more than 750° C. Such temperature melts the aluminium wiring under the plasma TEOS film.

The plasma annealing is most effective nitrogenizing of the plasma TEOS film.

Since the plasma annealing is performed at the temperature of less than 450° C., such annealing never affects adversely the first-layer aluminum wirings 32a, 32c to 32e formed below the fourth interlayer insulating film 33.

Meanwhile, in Patent Application Publication (KOKAI) Hei 10-83990 (U.S. Pat. No. 6,017,784), it is set forth that the silicon oxide film is formed by using the TEOS gas and then hydrogen in the silicon oxide film is degassed by the $N_2$ or $N_2O$ plasma process. This plasma process is neither applied to the polished silicon oxide film nor the silicon oxide film covering the ferroelectric capacitor.

In contrast, in the embodiment of the present invention, after the surface of the fourth interlayer insulating film 33 made of $SiO_2$ formed by using The TEOS is polished, the plasma annealing is applied to the fourth interlayer insulating film 33. In the above reference, there is no recitation to the effect that the $N_2O$ plasma annealing is effective to remove the moisture that enters in the polishing process. Also, in the embodiment of the present invention, it becomes apparent that good characteristics of the dielectric or high-dielectric capacitor Q can be maintained via the plasma annealing under the above conditions.

Figure 11:
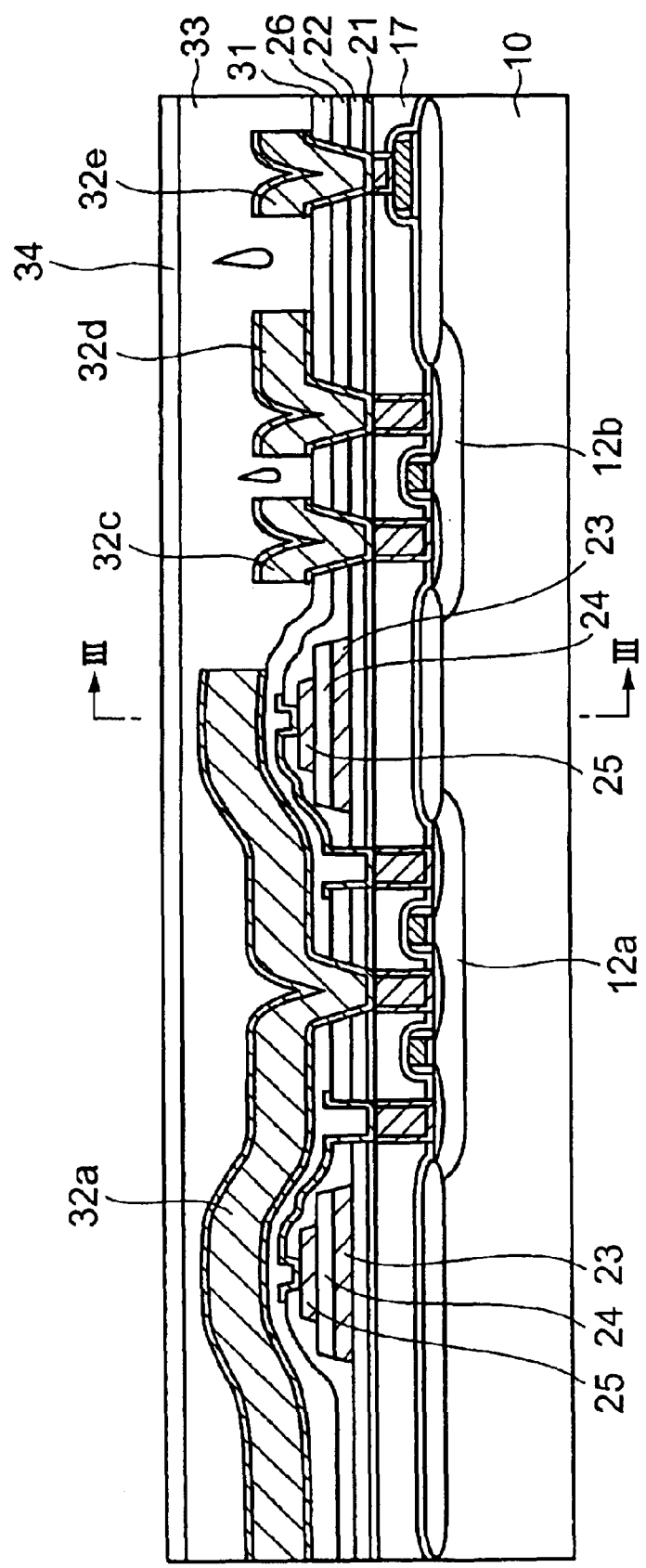

As shown in FIG. 11, after the above plasma annealing has been finished, the TEOS film as a redeposited interlayer insulating film 34 is formed on the fourth interlayer insulating film 33 to have a thickness of more than 100 nm, e.g., 200 nm. As described later, the redeposited interlayer insulating film 34 is formed to cover cavities that appear on the polished surface of the fourth interlayer insulating film 33. The redeposited interlayer insulating film 34 acts as a cap layer and also has an advantage to prevent the moisture reabsorption of the fourth interlayer insulating film 33. An optimum film thickness of the redeposited interlayer insulating film 34 will be described later.

In this case, the $N_2O$ plasma annealing may be applied to the redeposited interlayer insulating film 34.

Then, as described above, sometimes the cavities that are called key holes or slits (also called blowholes or voids) appear on the polished surface of the fourth interlayer insulating film 33. The reason for this will be given in the following.

If the TEOS film is formed by the plasma enhanced CVD method, such TEOS film is grown isotropically. Then, the film thickness becomes about 2.0 $\mu$m, the cavities are ready to generate between the first-layer aluminum wirings, i.e., between the bit lines 32a in the memory cell region 1 and the first-layer aluminum wirings 32c to 32e in the peripheral circuit region 2.

Figure 17A:
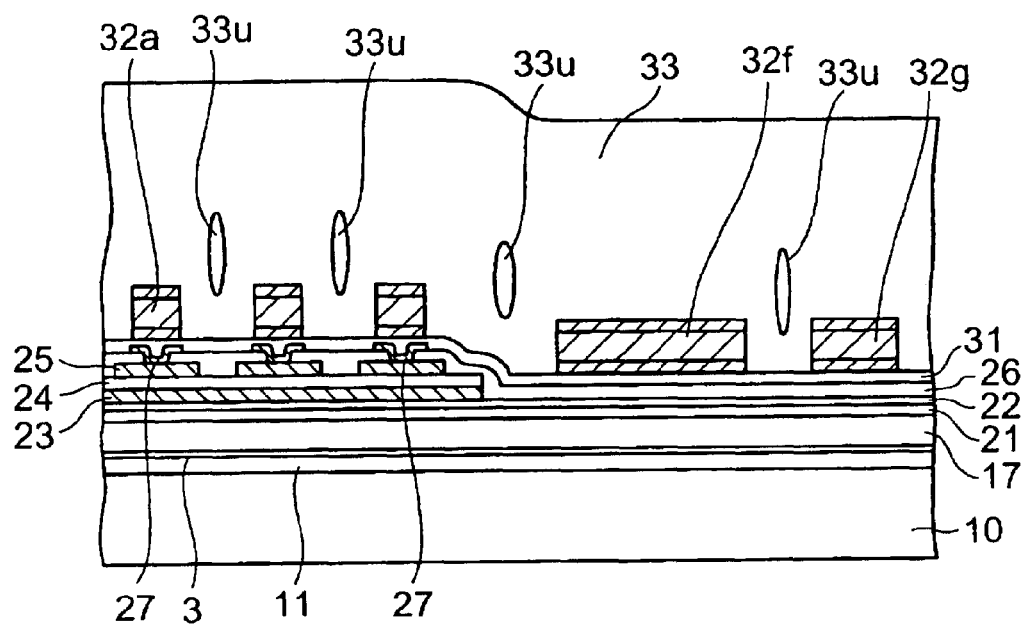
FIG. 17A is a sectional view showing a sectional shape taken along a I—I line in FIG. 8.

In this case, as shown in FIG. 17A, since the bit lines 32a are lifted up by the capacitor Q, the cavities 33u generated between the bit lines 32a are formed at the higher location than those in other regions.

Figure 17B:
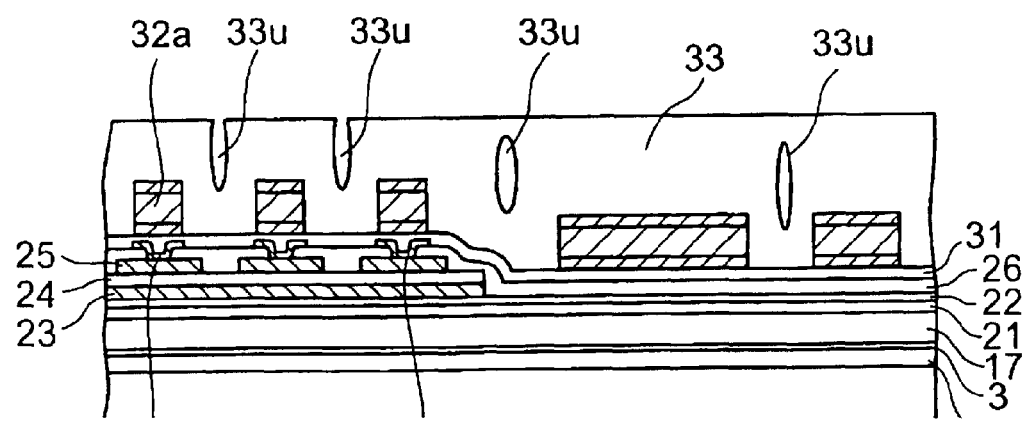
FIG. 17B is a sectional view showing a sectional shape taken along a II—II line in FIG. 9.

Therefore, as shown in FIG. 17B, after the fourth interlayer insulating film 33 formed of the TEOS film is polished, the bit lines 32a formed in the memory cell region 1 are easily exposed from the polished surface.

FIG. 17A is a sectional view showing a sectional shape taken along a I—I line in FIG. 8, and FIG. 17B is a sectional view showing a sectional shape taken along a II—II line in FIG. 9. In FIG. 17A and FIG. 17B, references 32f, 32g denotes the first-layer aluminum wiring respectively.

In this manner, the cavities 33u exposed from the fourth interlayer insulating film 33 in the memory cell region 1 appear like a slit along the bit lines 32a between them. Therefore, if a wiring forming metal film is directly formed on the fourth interlayer insulating film 33 in the situation that the cavities 33u are exposed, the metal film is filled into the cavities. Thus, after the wiring is formed by patterning the metal film, the metal film in the cavities 33u is not removed and be still left. Since the metal film in the cavities 33u acts as the medium that short-circuits the mutual wirings formed of the same metal film, it is necessary not to form previously the metal film in the cavities 33u.

Figure 17C:
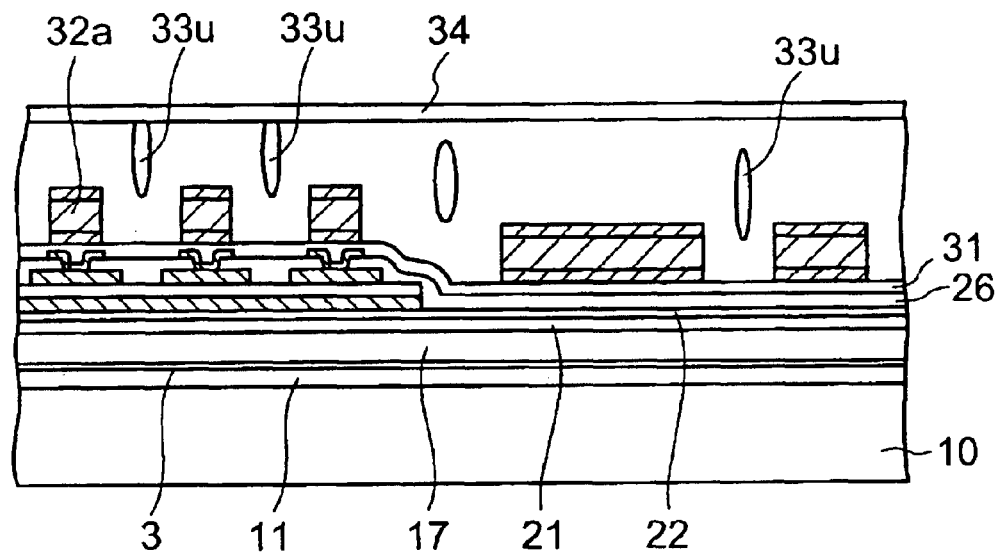
FIG. 17C is a sectional view showing a sectional shape taken along a III—III line in FIG. 11.

In the present embodiment, as shown in FIG. 11, since the polished surface of the fourth interlayer insulating film 33 is covered with the redeposited interlayer insulating film 34 after the fourth interlayer insulating film 33 is polished, the metal film is not formed in the cavities 33u exposed from the polished surface of the fourth interlayer insulating film 33. A sectional shape taken along a III—III line in FIG. 11 is shown like FIG. 17C.

Figure 18A:
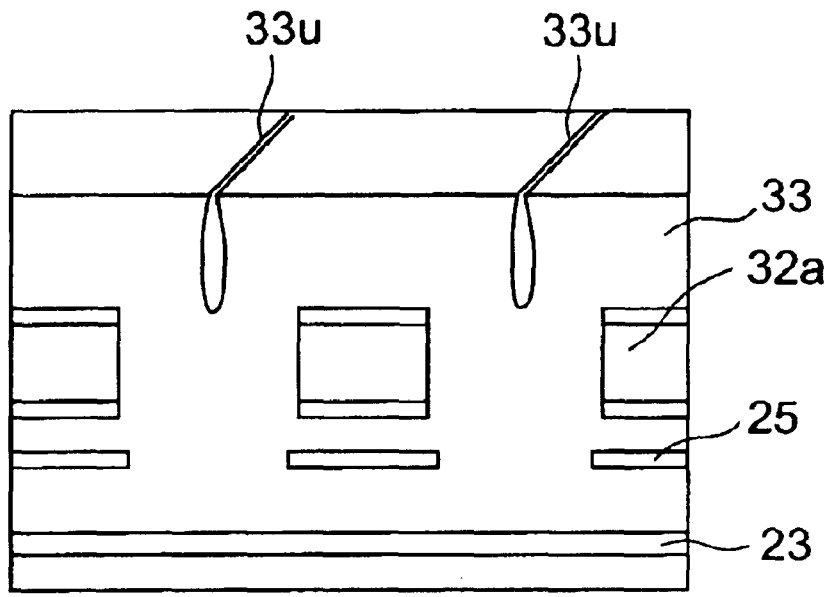
FIG. 18A is a sectional view showing a sectional shape in FIG. 17B depicted based on a microphotograph.
Figure 18B:
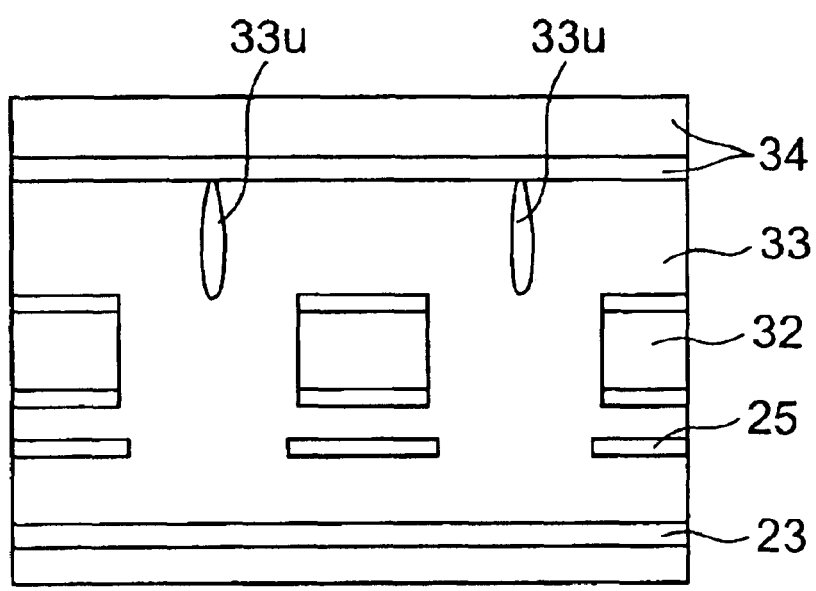
FIG. 18B is a sectional view showing a sectional shape in FIG. 17C depicted based on a microphotograph.

FIG. 18A is a sectional view showing the fourth interlayer insulating film 33 and an underlying structure if no redeposited interlayer insulating film 34 is provided, and FIG. 18B is a sectional view showing the state that the redeposited interlayer insulating film 34 is formed on the fourth interlayer insulating film 33. In this case, FIGS. 18A and 18B are illustrated based on a sectional microphotographs of the memory cell region of the FeRAM.

After the above redeposited interlayer insulating film 34 is formed, the process is advanced to the step of forming the second-layer aluminum wiring, as shown in FIG. 12 to FIG. 16.

Figure 12:
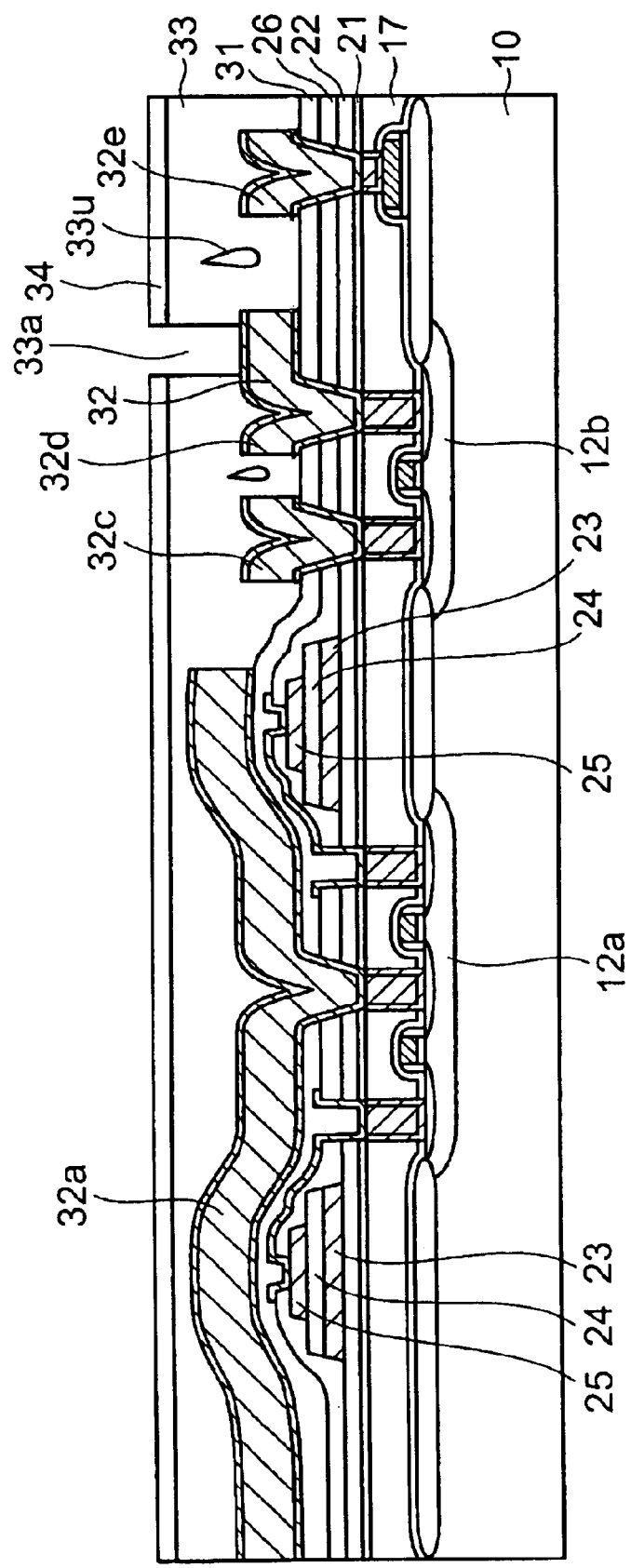

First, as shown in FIG. 12, a via hole 33a that reaches the first-layer aluminum wiring, e.g., the wiring 32d in the peripheral circuit region 2 is formed by patterning the redeposited interlayer insulating film 34 and the fourth interlayer insulating film 33 by using the photolithography method. After this, the surface of the wiring 32d formed under the fourth interlayer insulating film 33 is etched by a predetermined depth, e.g., a depth of 35 nm, through the via hole 33a.

Figure 13:
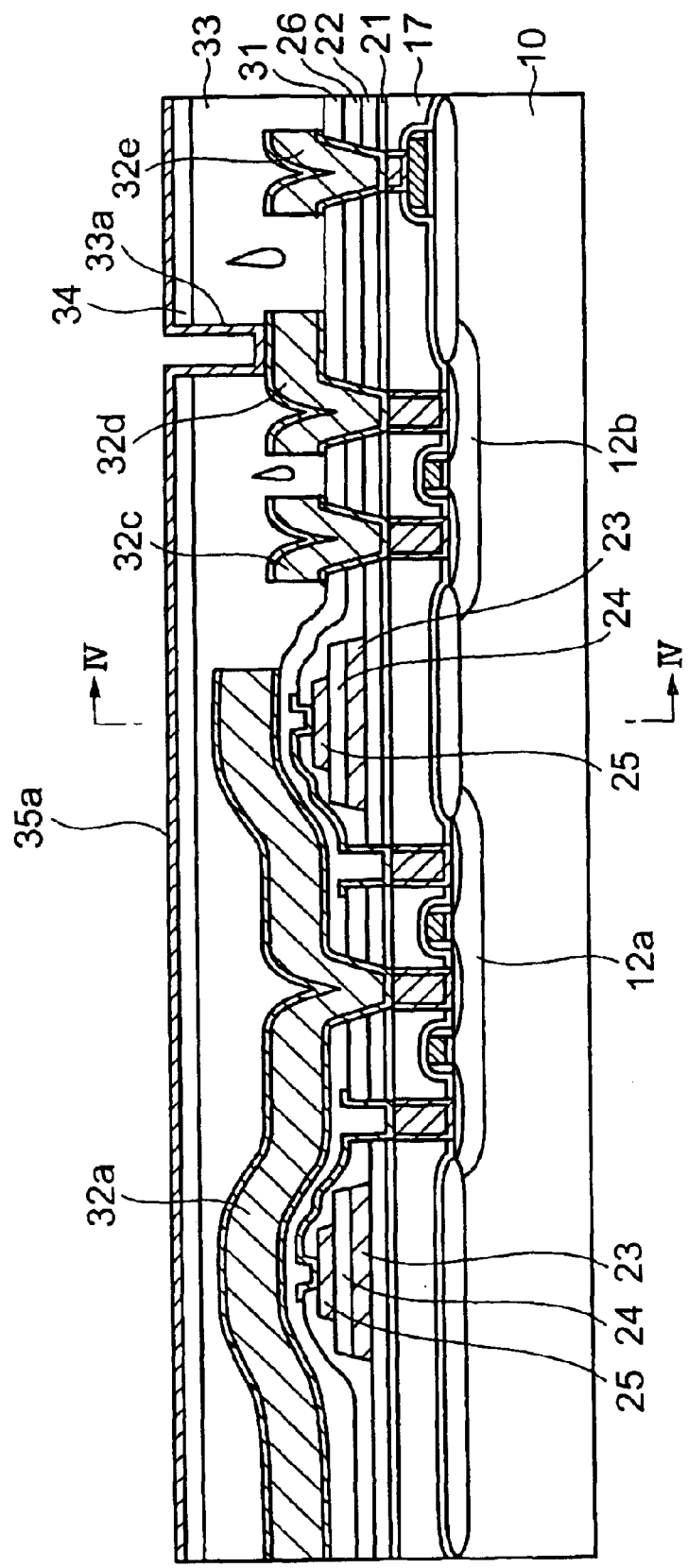
Figure 17D:
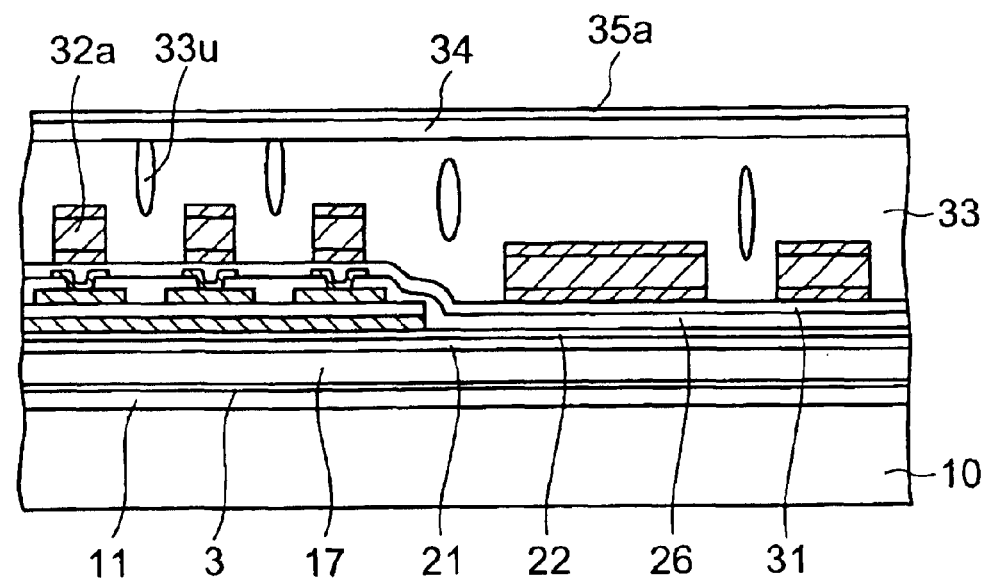
FIG. 17D is a sectional view showing a sectional shape taken along a IV—IV line in FIG. 13.

Then, as shown in FIG. 13, a Ti film of 20 nm thickness and a TiN film of 50 nm thickness are formed in sequence in the via hole 33a and on the redeposited interlayer insulating film 34 by the sputtering. These films constitute a glue layer 35a. Here, FIG. 17D is a sectional view showing a sectional shape taken along a IV—IV line in FIG. 13.

Figure 14:
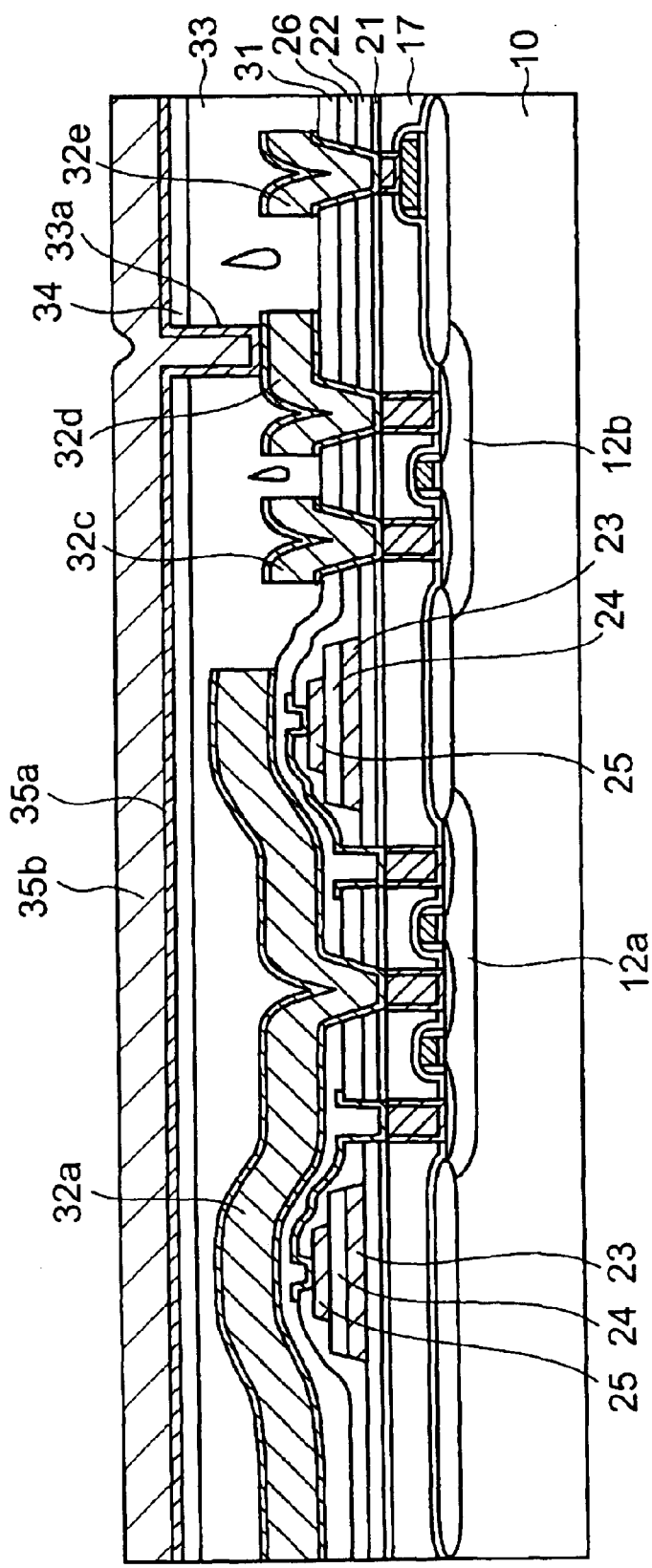

Then, tungsten seed (not shown) is formed on the glue layer 35a by the CVD method using a tungsten hexafluoride ($WF_6$) gas and a silane ($SiH_4$) gas. Then, a tungsten film 35b is formed on the glue layer 35a at the growth temperature of 430° C. by adding a hydrogen ($H_2$) gas to the $WF_6$ gas and the silane ($SiH_4$) gas. Thus, as shown in FIG. 14, the glue layer 35a and the tungsten film 35b are filled in the via hole 33a.

Figure 15:
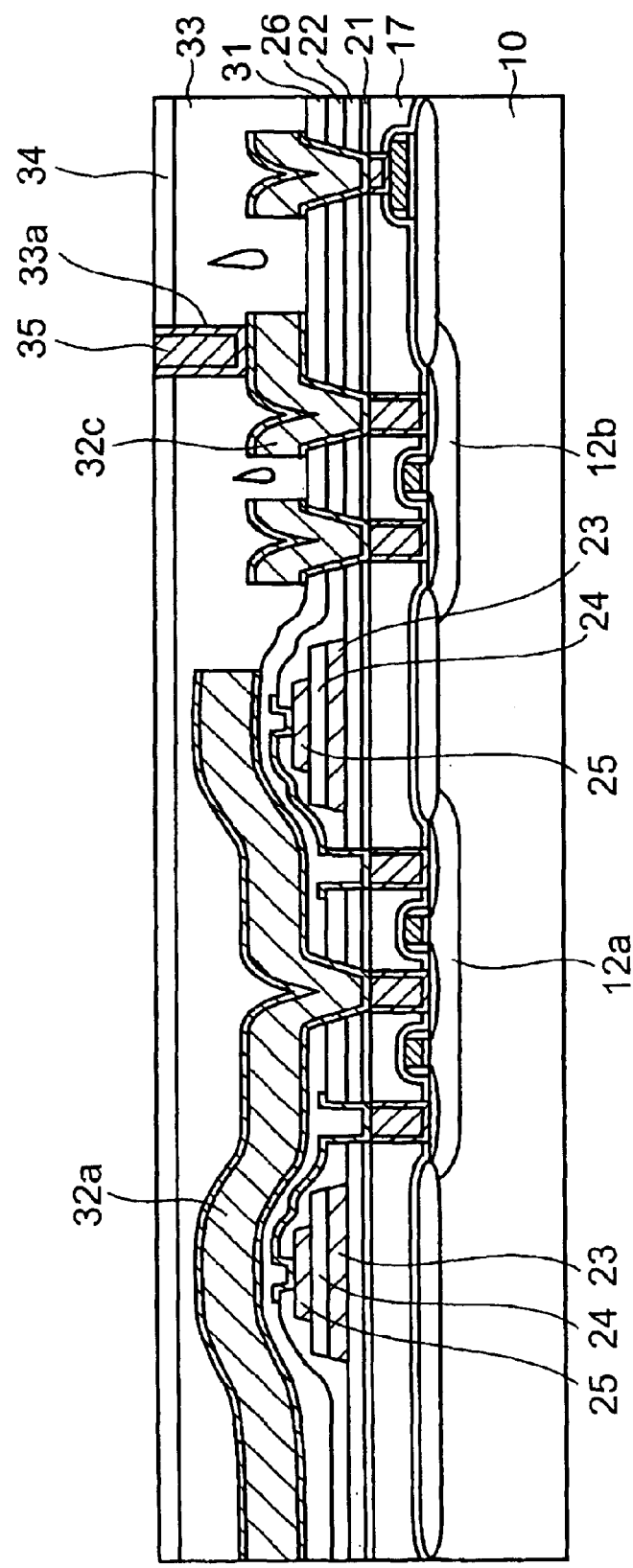

Then, the tungsten film 35b formed on the redeposited interlayer insulating film 34 is removed by the CMP method or the etching-back to be left only in the via hole 33a. At this time, the glue layer 35a formed on the redeposited interlayer insulating film 34 may be removed or left as it is. FIG. 15 shows the case where the glue layer 35a is removed from the upper surface of the redeposited interlayer insulating film 34 by the CMP method.

Accordingly, a via (plug) 35 that electrically connects the wiring 32 to the overlying wiring 36 is formed in the via hole 33a.

Figure 19A:
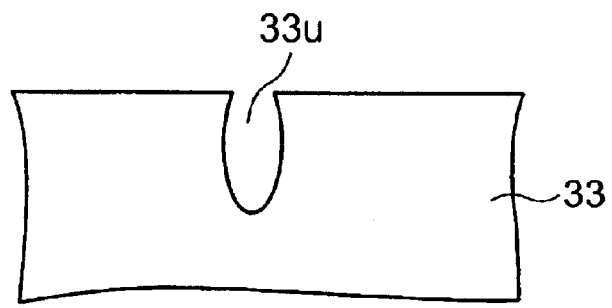
FIGS. 19A to 19D are sectional views showing steps by which cavities shown in FIG. 17B are not sufficiently buried by an insulating film.
Figure 19B:
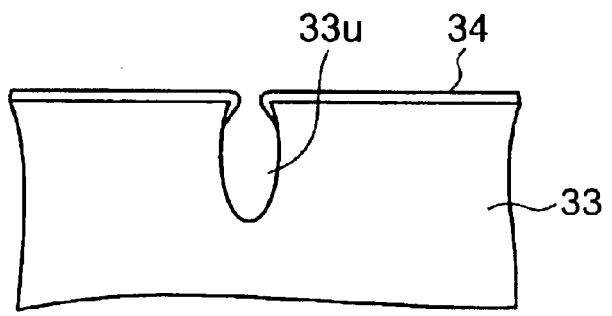
Figure 19C:
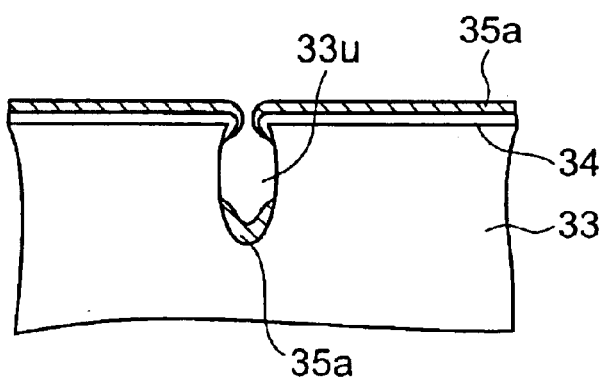
Figure 19D:
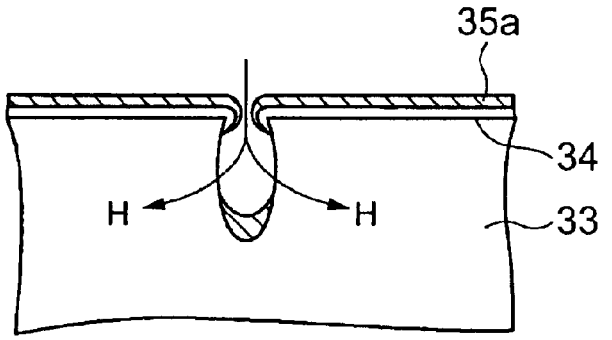

Meanwhile, a width of the cavity 33u appeared from the polished surface of the fourth interlayer insulating film 33 is not uniform because of variation in polishing by the CMP method and so on. If the exposed width of the cavity 33u is varied, following problems are caused. That is, as shown in FIG. 19A, when the thin redeposited interlayer insulating film 34 is formed on the cavities 33u exposed from the fourth interlayer insulating film 33, the cavities 33u are not completely covered with the redeposited interlayer insulating film 34 and a part of them is still exposed, as shown in FIG. 19B. Then, as shown in FIG. 19C, if the above glue layer 35a is formed under such condition, there is a possibility that such glue layer 35a is disconnected on the cavities 33u to form slits. If such slits exit, hydrogen in the reaction gas employed in forming the tungsten film 35b enters into the fourth interlayer insulating film 33 via the slits, as shown in FIG. 19D. The hydrogen penetrated into the fourth interlayer insulating film 33 is not preferable since it reduces the capacitor Q to degrade the capacitor characteristic.

Therefore, it becomes apparent from the experimental results that, in order to cover without fail the cavities 33u exposed from the fourth interlayer insulating film 33, the film thickness of the redeposited interlayer insulating film 34 in excess of at least 300 nm is needed.

Then, it is examined to which extent the film thickness of the redeposited interlayer insulating film 34 should be formed in order to prevent the situation that the glue layer 35a and the tungsten film 35b are filled into the cavities 33u.

Figure 20:
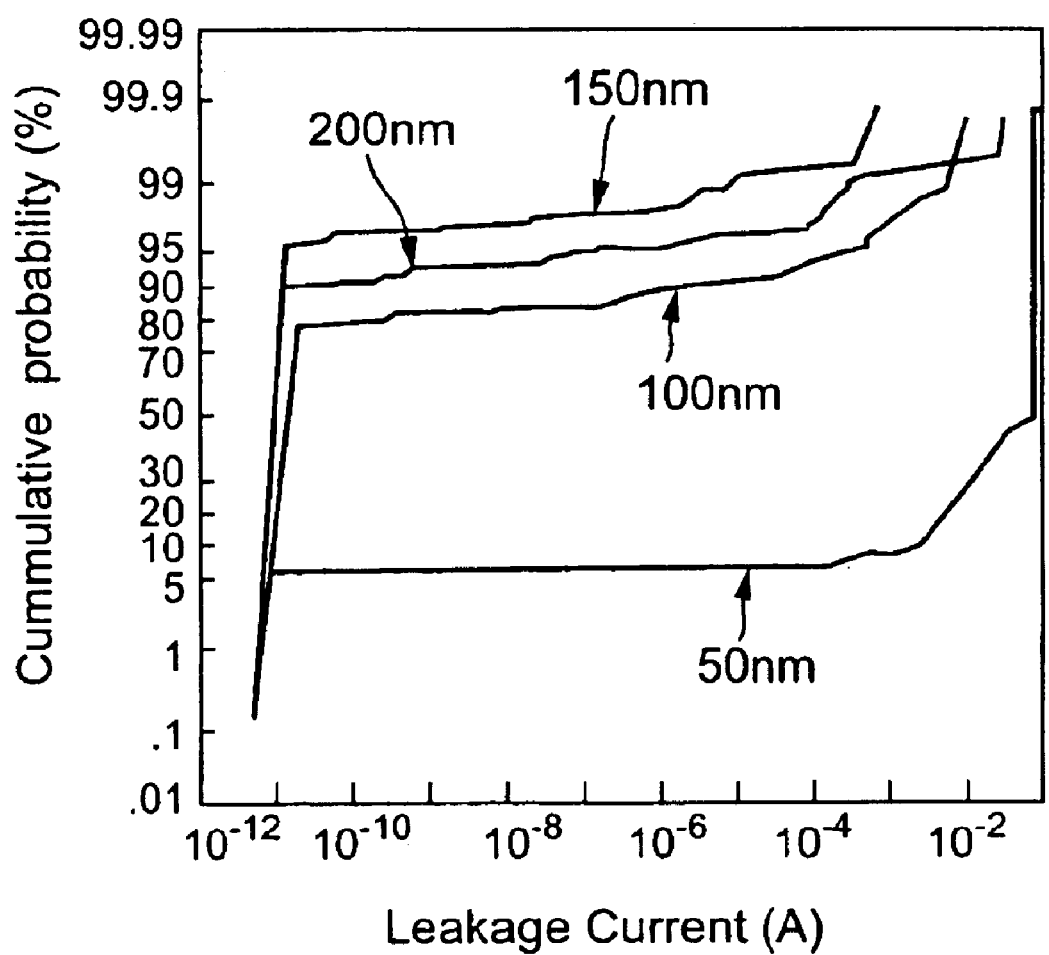
FIG. 20 is a graph showing a leakage current and a cumulative probability in a capacitor that is used in a memory cell of a semiconductor device according to the embodiment of the present invention, wherein an ordinate denoting the cumulative probability and an abscissa denoting the leakage current are plotted in a logarithmic scale.

Thus, the result shown in FIG. 20 is derived. An ordinate of FIG. 20 denotes a leakage occurring frequency between the wirings and an abscissa denotes a leakage current value. According to the result in FIG. 20, it can be understood that, if the film thickness of the redeposited interlayer insulating film 34 is 50 nm, the leakage occurring frequency between the wirings is large and then leakage occurring frequency between the wirings is reduced as the film thickness is increased, and the short-circuit between the wirings can be substantially prevented at the film thickness of 100 nm. Accordingly, it is desired that, in order to reduce the leakage between the wirings, because of the exposure of the cavities 33u, the film thickness of the redeposited interlayer insulating film 34 should be set to at least 100 nm.

In contrast, a relationship between the film thickness of the redeposited interlayer insulating film 34 and change in the polarization charge amount of the capacitor is examined based on the accelerated test after a series steps are finished such that the glue layer 35a and the tungsten film 35b are formed on the redeposited interlayer insulating film 34, then the plug 35 is formed by patterning them, the second-layer aluminum wiring described later is formed thereon, and then the second-layer aluminum wiring is covered with the insulating film. Then, the result shown in Table 1 are obtained. In this case, the accelerated test is performed by heating the substrate up to the temperature of 200° C. for one hour in the atmosphere.

TABLE 1

| Thickness of Second interlayer Insulating film | polarization charge amount | |
|---|---|---|
| | after process out | after baking |
| 0 nm | 24.2 $\mu C/cm^2$ | 11.4 $\mu C/cm^2$ |
| 100 nm | 25.1 $\mu C/cm^2$ | 17.5 $\mu C/cm^2$ |
| 300 nm | 25.3 $\mu C/cm^2$ | 22.6 $\mu C/cm^2$ |

According to Table 1, in the state prior to the accelerated test, the polarization charge amount is slightly larger if the redeposited interlayer insulating film is formed thicker. In contrast, after annealing, difference of the polarization charge amount between samples becomes remarkable. Especially, if the film thickness of the redeposited interlayer insulating film 34 is 0 nm, i.e., if the redeposited interlayer insulating film 34 is not formed, the polarization charge amount is reduced to the half or less after the annealing and the characteristic of the ferroelectric capacitor Q is considerably degraded. In addition, if the film thickness of the redeposited interlayer insulating film 34 is 300 nm, degradation of the ferroelectric capacitor Q is slight. Thus, the polarization charge amount after the annealing is reduced to 22.6 $\mu C/cm^2$, which is a sufficient value to operate the FeRAM normally.

The film thickness of the redeposited interlayer insulating film 34 such as 300 nm is decided with regard to the variation of the exposed portion of the cavities 33u.

On the contrary, if the redeposited interlayer insulating film 34 is formed excessively thick, an aspect ratio of the via hole 33a is increased, so that coverage of the glue layer 35a and the tungsten film 35b in the via hole 33a becomes worse. That is, the upper limit value of the film thickness of the redeposited interlayer insulating film 34 is decided based on the aspect ratio of the via hole 33a. For example, in the event that the aspect ratio of the via hole 33a is set to 2.3, the redeposited interlayer insulating film 34 needs the film thickness of about 0.4 $\mu m$ (400 nm) if a diameter of the via hole 33a is set to 0.6 μm and the thickness of the fourth interlayer insulating film 33 is set to 1.0 μm.

After the steps of forming the redeposited interlayer insulating film 34 and the via 35 according to above steps have been completed, a wiring 36 is formed by forming a 50 nm thick first TiN film, a 500 nm Al film, and a 50 nm thick second TiN film in sequence on the redeposited interlayer insulating film 34 and then patterning these films. If the glue layer 35a is left on the upper surface of the redeposited interlayer insulating film 34, formation of the first TiN film is omitted and thus the aluminum film and thus the second TiN film are formed on the glue layer 35a.

Figure 16:
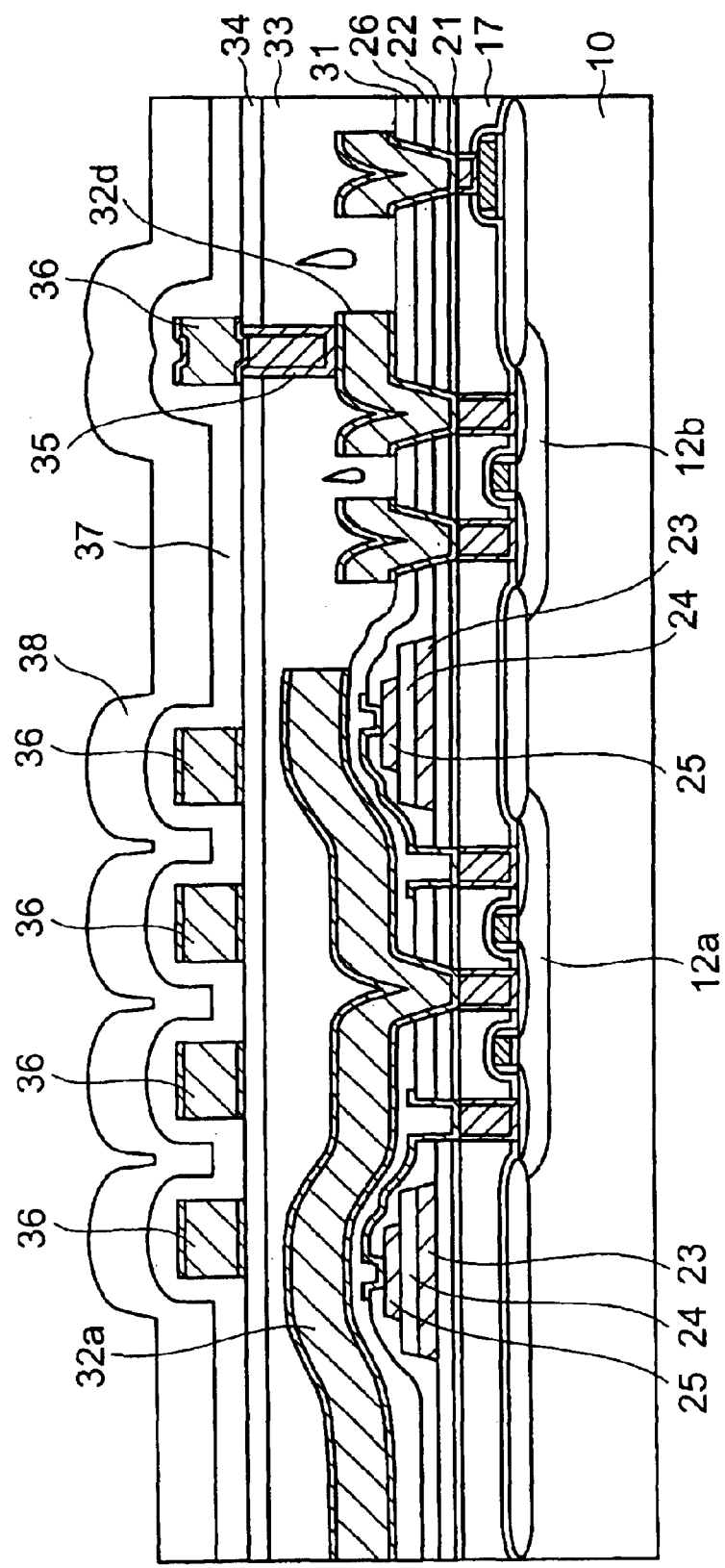

Then, as shown in FIG. 16, a second-layer aluminum wiring 36 is formed on the redeposited interlayer insulating film 34 by patterning the first and second TiN films and the Al film or the second TiN film, the Al film, and the glue layer by means of the photolithography method.

Then, an $SiO_2$ film of 200 nm thickness is formed as a first cover insulating film 37 on the second-layer aluminum wiring 36 and the redeposited interlayer insulating film 34 by the plasma enhanced CVD method using TEOS. Then, a second cover insulating film 38 made of SiN and having a thickness of 500 nm is formed on the first cover insulating film 37 by the plasma enhanced CVD method. The second-layer wiring 36 is covered with the first cover insulating film 37 and the second cover insulating film 38.

Figure 21:
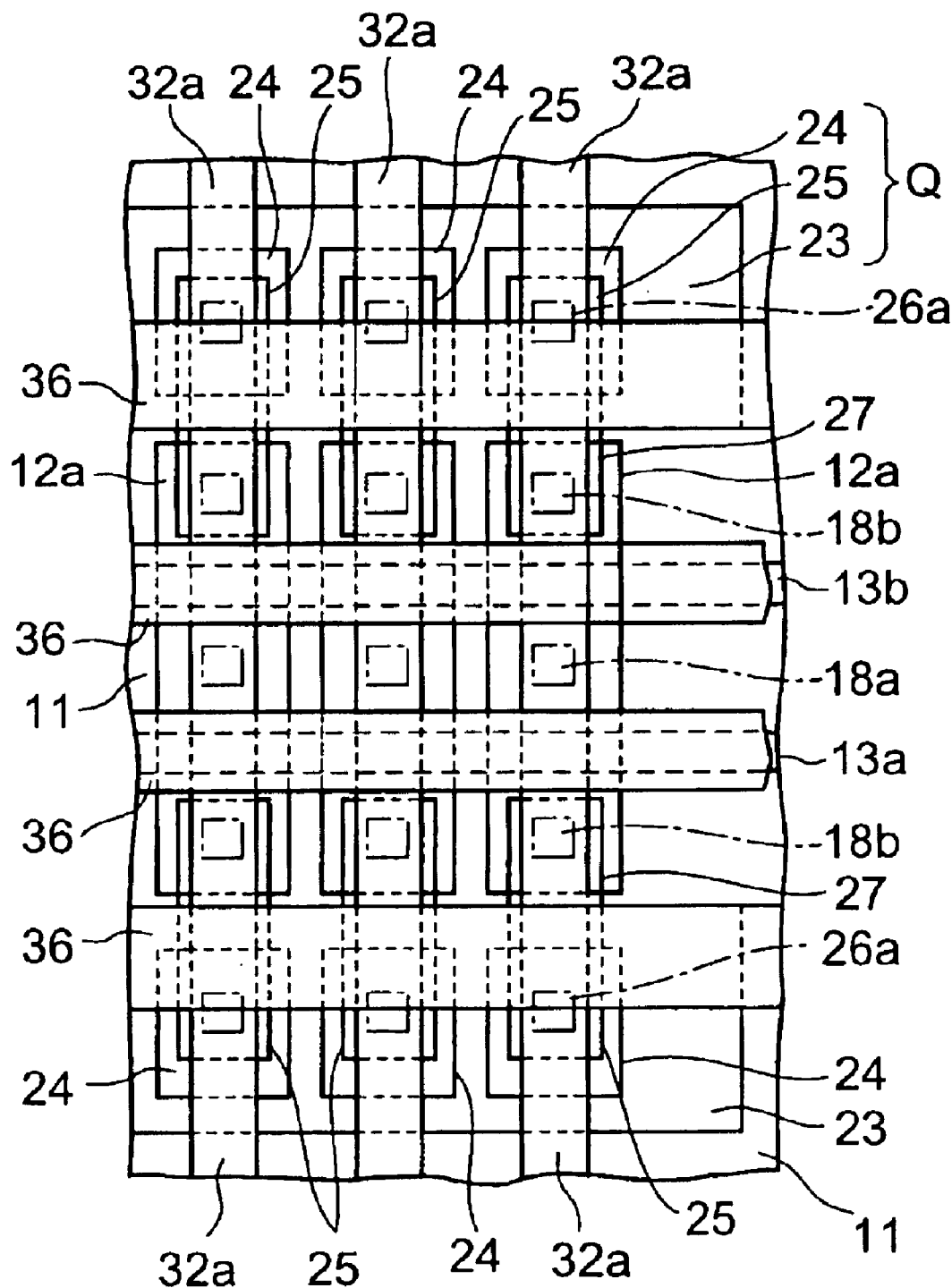
FIG. 21 is a plane view showing arrangement of conductive patterns of a memory cell region of the semiconductor device according to the embodiment of the present invention.

Planar positional relationships between various conductive patterns in the memory cell region 1 after the second-layer wiring 36 is formed are shown in FIG. 21. In this case, insulating films except the device isolation insulating film 11 are omitted from FIG. 21.

With the above steps, a basic structure of the FeRAM using the ferroelectric substance as the capacitor dielectric film 24 can be completed.

In the present embodiment, the upper surface of the fourth interlayer insulating film 33 covering the capacitor Q and the first-layer aluminum wiring 32a is planarized by the CMP method. Accordingly, pattern precision of the second-layer aluminum wiring 36 that is formed flat on the fourth interlayer insulating film 33 formed on the capacitor Q and the wiring 32a can be improved.

Also, since the moisture in the fourth interlayer insulating film 33 is removed by applying the $N_2O$ plasma annealing after the fourth interlayer insulating film 33 is polished, reduction and degradation of the ferroelectric film (capacitor dielectric film 24) can be avoided even when the heating is applied by succeeding steps. As a result, the FeRAM having the good characteristics can be manufactured. In addition, since the $N_2O$ plasma annealing is carried out at the temperature of less than 450° C., the first-layer aluminum wiring is never degraded.

The polarization charge amount of the capacitor Q is examined in both cases that the FeRAM is formed by applying the $N_2O$ plasma annealing step and the FeRAM is formed by omitting such $N_2O$ plasma annealing step. Then, the results shown in Table 2 are derived. It has been confirmed that the $N_2O$ plasma annealing is effective to prevent the degradation of the capacitor.

TABLE 2

| | polarization charge amount (QSW) |
|---|---|
| $N_2O$ plasma annealing | 21.3 $\mu C/cm^2$ |
| No $N_2O$ plasma annealing | 15.4 $\mu C/cm^2$ |

In the above embodiment, the case is discussed where the dehydration process is applied to the fourth interlayer insulating film 33 by the $N_2O$ plasma annealing. But, the gas used in the dehydration process is not limited to the $N_2O$ gas. For example, the same advantage can be achieved by the plasma annealing employing a single gas such as an $N_2$ gas or an $O_2$ gas or an NO gas or a mixed gas such as $N_2O+N_2$, or $N_2O+O_2$. The inert gas such as Ar, He, or Ne may be mixed with the single gas or the mixed gas.

Furthermore, in the above embodiment, the redeposited interlayer insulating film 34 is formed after the dehydration process is applied to the fourth interlayer insulating film 33. In this case, the redeposited interlayer insulating film 34 is formed on the fourth interlayer insulating film 33 which has been subjected to the CMP polishing and then the dehydration process may be applied.

If the redeposited interlayer insulating film 34 is formed thin like the above embodiment, an amount of moisture contained in the redeposited interlayer insulating film 34 is very small. In contrast, if the redeposited interlayer insulating film 34 is formed thick, there is a possibility that the capacitor dielectric film is reduced by the moisture contained in the redeposited interlayer insulating film 34. In order to prevent this, after the redeposited interlayer insulating film 34 is formed, the dehydration process may applied by the plasma annealing using $N_2O$ or NO. However, in this case, if the redeposited interlayer insulating film 34 is formed of the silicon oxide nitride (SiON) film by the plasma enhanced CVD method or the silicon nitride (SiN) film by the plasma enhanced CVD method, the moisture in the fourth interlayer insulating film 33 cannot be sufficiently removed since these films are hard to penetrate. Therefore, it is preferable that, if the plasma annealing is applied after the redeposited interlayer insulating film 34 is formed, the redeposited interlayer insulating film 34 should be formed of the plasma TEOS film, the $O_3$-TEOS film, or the plasma $SiO_2$ film.

More particularly, in place of the TEOS film (P-TEOS film) formed by the above plasma enhanced CVD method, the TEOS ($O_3$-TEOS) film formed by the thermal CVD method using $O_3$ and TEOS, the $SiO_2$ (P-$SiO_2$) film formed by the plasma enhanced CVD method, the $SiO_2$ film formed by the non-bias HDP (High Density Plasma)-CVD, the SiON (P-SiON) film formed by the plasma enhanced CVD method, the SiN (P-SiN) film formed by the plasma enhanced CVD method, etc. may be employed as the redeposited interlayer insulating film 34. In this case, since a moisture containing amount of the $O_3$-TEOS film is larger than the P-TEOS film, the P-TEOS film is employed in the above steps. However, since the SiON film and the SiN film have low moisture permeability, if these films are used as the redeposited interlayer insulating film 34, the redeposited interlayer insulating film 34 must be formed after the dehydration process of the fourth interlayer insulating film 33 is performed.

Figure 22:
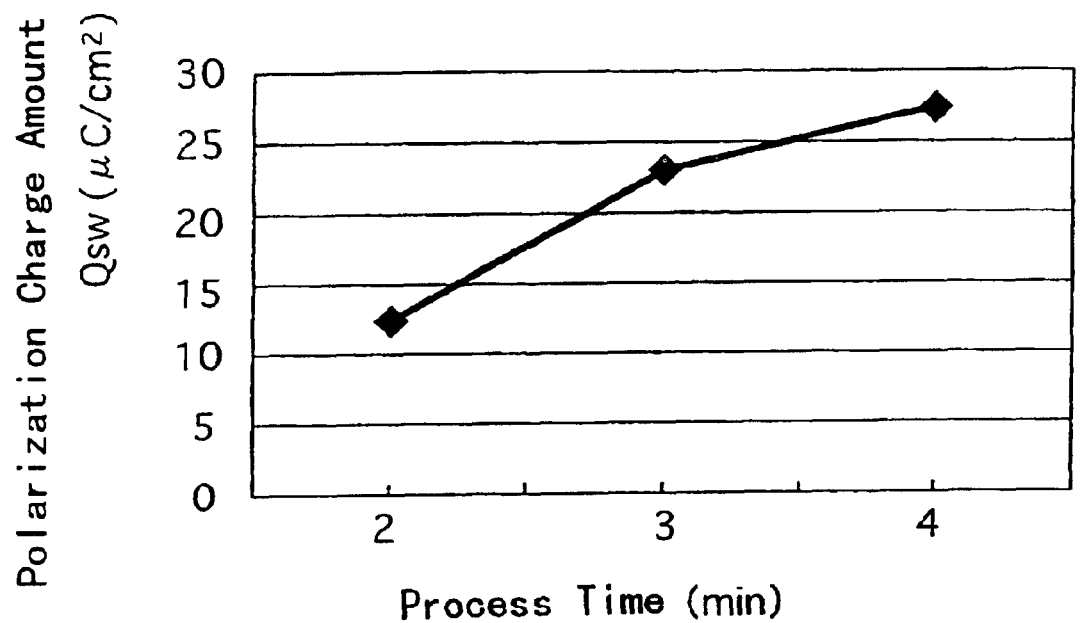
FIG. 22 is a graph showing a dependency of a polarization charge amount on a dehydration process time in the capacitor formed in the semiconductor device according to the embodiment of the present invention.

FIG. 22 is a graph showing a dependency of the polarization charge amount on a dehydration process time, wherein an abscissa denotes the plasma annealing process time of the interlayer insulating film and an ordinate denotes the polarization charge amount (QSW). As the plasma annealing conditions, the temperature is 350° C., the plasma applied power is 300 W, a flow rate of $N_2O$ is 700 sccm, and a flow rate of the $N_2$ gas is 200 sccm. It is possible to say that, if a value of the polarization charge amount QSW is increased, the polarization characteristic can be improved.

As can be seen from FIG. 22, the sufficient characteristic can be obtained by setting the plasma annealing process time to three minutes or more. The polarization charge amount of the ferroelectric film in the initial state is about 28 $\mu C/cm^2$.

Thus, the polarization charge amount can be recovered up to the initial state by executing the plasma annealing for four minutes.

In the above embodiment, the $SiO_2$ film formed by the plasma enhanced CVD method using the TEOS gas is employed as the fourth interlayer insulating film 33. In addition to this, the fourth interlayer insulating film 33 may be formed by the TEOS ($O_3$-TEOS) film formed by the thermal CVD method using $O_3$ and TEOS, the $SiO_2$ (P-$SiO_2$) film formed by the plasma enhanced CVD method, etc. The growth rate of the $O_3$ TEOS film is smaller than that of the P-TEOS film. And, it is hard to form a cavity in the $O_3$-TEOS film.

In the above embodiment, the FeRAM and steps of forming the same are explained. Also, in the volatile memory having the high-dielectric capacitor (DRAM), insulating property of the high-dielectric material is deteriorated by the moisture and the annealing, and the interface between the high-dielectric material film and the electrode is ready to degrade. Therefore, like the above, after the upper surface of the insulating film formed on the ferroelectric capacitor is planarized by the CMP method, the dehydration process of the insulating film is performed by using the gas such as $N_2O$, NO, etc., otherwise the redeposited interlayer insulating film may be formed on the surface planarized after the dehydration process or before the dehydration process by using P-TEOS. The high-dielectric material such as (BaSr)$TiO_3$, etc. may be employed as the high-dielectric material.

Also, the present invention may be applied to the fabrication of the hybrid system LSI which consists of the ferroelectric nonvolatile semiconductor memory or the high-dielectric semiconductor memory and the logic device.

As described above, according to the present invention, since the insulating film formed on the capacitor and the wiring formed on the capacitor is planarized by polishing, the wiring can be easily formed with good precision on the flat surface of the insulating film.

Also, since the hydration process is applied to the polished insulating film by the plasma annealing containing $N_2O$ or NO, the moisture attached to the surface of the insulating film or the moisture penetrated into the insulating film can be more surely removed and thus reduction of the ferroelectric material or the high-dielectric material constituting the capacitor can be prevented. As a result, the degradation of the dielectric characteristic of the ferroelectric material or the high-dielectric material can be avoided, and thus the FeRAM or DRAM having the good characteristic can be manufactured.

What is claimed is:

1. A semiconductor device, comprising:
    a transistor having a first impurity region and a second impurity region formed on a semiconductor substrate, and a gate electrode formed over the semiconductor substrate;
    a first insulating film formed over the transistor;
    a capacitor formed over the first insulating film, the capacitor having a dielectric film made of one of a ferroelectric material and a high-dielectric material, and an upper electrode and a lower electrode positioned to put the dielectric film therebetween;
    a silicon oxide film formed over the capacitor to form a planarized surface;
    wherein nitrogen resides all over the planarized surface of the silicon oxide film; and
    a wiring formed over the silicon oxide including nitrogen.
2. A semiconductor device according to claim 1, wherein cavities are formed inside of the silicon oxide film.
3. A semiconductor device according to claim 2, further comprising:
    a third insulating film formed on the silicon oxide film.
4. A semiconductor device according to claim 1, further comprising,
    a second insulating film formed between the capacitor and the silicon oxide film; and a wiring formed on the second insulating film.
5. A semiconductor device, comprising:
    a transistor having a first impurity region and a second impurity region formed on a semiconductor substrate, and a gate electrode formed over the semiconductor substrate;
    a first insulating film formed over the transistor,
    a capacitor formed over the first insulating film, the capacitor having a dielectric made of one of ferroelectric material and a high-dielectric material, and an upper electrode and a lower electrode positioned to put the dielectric film therebetween;
    a second insulating film formed over the capacitor;
    a local interconnection formed over the second insulating film to electrically connect the upper electrode of the capacitor with the first impurity region;
    a third insulating film formed over the local interconnection and the second insulating film;
    a first wiring formed over the third insulating film and electrically connected to the second impurity region via a hole which is formed over the first insulating film, the second insulating film, and the third insulating film;
    a fourth insulating film formed over the first wiring to serve an upper planarized surface,
    wherein nitrogen resides all over the upper planarized surface of the fourth insulating film; and
    a second wiring formed over the fourth insulating film including nitrogen.
6. A semiconductor device according to claim 5, wherein cavities, a part of which are exposed from the upper surface of the fourth insulating film, are formed inside of the fourth insulating film.
7. A semiconductor device according to claim 6, wherein the cavities are located in regions between a plurality of capacitors.
8. A semiconductor device according to claim 6, further comprising:
    a fifth insulating film formed on the fourth insulating film to cover the cavities which are exposed from the upper surface of the fourth insulating film.
9. A semiconductor device according to claim 5, wherein the second wiring is connected to the first wiring via the hole formed in the fourth insulating film.
10. A semiconductor device according to claim 5, wherein the third insulating film and the fourth insulating film are formed of a silicon oxide film.
11. A semiconductor device according to claim 5, wherein an upper surface of the first insulating film is a planarized surface.
12. A semiconductor device, comprising:
    a transistor having a first impurity region and a second impurity region formed over a semiconductor substrate, and a gate electrode formed over the semiconductor substrate;
    a first insulating film formed over the transistor;
    a capacitor formed over the first insulating film, the capacitor having a dielectric film made of one of a ferroelectric material and a high-dielectric material, and an upper electrode and a lower electrode positioned to put the dielectric film therebetween; and a second insulating film formed over the capacitor to serve as an upper planarized surface;

wherein nitrogen resides all over the upper planarized surface of the second insulating film; and a wiring formed over the second insulating film including nitrogen.

* * * * *